(12) United States Patent
Tokuhashi et al.

(10) Patent No.: US 10,889,900 B2
(45) Date of Patent: Jan. 12, 2021

(54) CERAMIC LAMINATE

(71) Applicant: NIPPON STEEL & SUMITOMO METAL CORPORATION, Tokyo (JP)

(72) Inventors: Keisuke Tokuhashi, Tokyo (JP); Keiichi Kimura, Tokyo (JP); Tomohiro Uno, Tokyo (JP); Yutaka Sato, Tokyo (JP)

(73) Assignee: NIPPON STEEL CORPORATION, Tokyo (JP)

( * ) Notice: Subject to any disclaimer, the term of this patent is extended or adjusted under 35 U.S.C. 154(b) by 0 days.

(21) Appl. No.: 16/081,737

(22) PCT Filed: Feb. 28, 2017

(86) PCT No.: PCT/JP2017/007981
§ 371 (c)(1),
(2) Date: Aug. 31, 2018

(87) PCT Pub. No.: WO2017/150572
PCT Pub. Date: Sep. 8, 2017

(65) Prior Publication Data
US 2019/0062923 A1     Feb. 28, 2019

(30) Foreign Application Priority Data

Mar. 1, 2016 (JP) ................... 2016-038555

(51) Int. Cl.
*C04B 35/593* (2006.01)
*C23C 24/04* (2006.01)
(Continued)

(52) U.S. Cl.
CPC .............. *C23C 24/04* (2013.01); *B32B 15/04* (2013.01); *C04B 35/593* (2013.01); *C23C 28/32* (2013.01);
(Continued)

(58) Field of Classification Search
CPC ....... C23C 24/04; B32B 15/04; C04B 35/593; H01B 1/02; H01B 3/12; H01B 5/14; H01L 23/36
See application file for complete search history.

(56) References Cited

U.S. PATENT DOCUMENTS

| | | | | |
|---|---|---|---|---|
| 5,866,245 A | * | 2/1999 | Toriyama | ............... B32B 18/00 156/89.27 |
| 2006/0108601 A1 | * | 5/2006 | Okamoto | .................. C23C 4/02 257/177 |

(Continued)

FOREIGN PATENT DOCUMENTS

| | | |
|---|---|---|
| JP | 63-233078 A | 9/1988 |
| JP | H06-063804 A | 3/1994 |

(Continued)

OTHER PUBLICATIONS

Mitomo et al., "Fine-Grained Silicon Nitride Ceramics Prepared from β-Powder", J. Am. Ceram. Soc., 78[1] 211-14 (Year: 1995).*

(Continued)

*Primary Examiner* — Daniel J. Schleis
*Assistant Examiner* — Kevin C T Li
(74) *Attorney, Agent, or Firm* — Birch, Stewart, Kolasch & Birch, LLP

(57) ABSTRACT

The present invention provides a ceramic laminate having excellent mechanical properties, heat dissipation property, insulating property, heat resistance and anti-reactivity, and particularly an insulative heat dissipating body having an excellent thermal cycle reliability and a high withstand voltage.
The ceramic laminate 1 according to the present invention is a ceramic laminate in which a ceramic film 3 is formed on a metal layer 2, wherein the ceramic film 3 has a minimum film thickness of 1 μm or more, contains silicon nitride and inevitable impurities, and has silicon nitride crystal grains (Continued)

having an average grain size of 300 nm or less in the film thickness direction and an average grain size of 500 nm or less in the in-plane direction. As a result, the present invention can provide a ceramic laminate having excellent mechanical properties, heat dissipation property, insulating property, heat resistance and anti-reactivity, and particularly an insulative heat dissipating body having an excellent thermal cycle reliability and a high withstand voltage.

15 Claims, 4 Drawing Sheets

(51) Int. Cl.
  *H01B 1/02* (2006.01)
  *H01B 3/12* (2006.01)
  *H01B 5/14* (2006.01)
  *C23C 28/00* (2006.01)
  *B32B 15/04* (2006.01)
  *H01L 23/36* (2006.01)
(52) U.S. Cl.
  CPC .............. *C23C 28/34* (2013.01); *H01B 1/02* (2013.01); *H01B 3/12* (2013.01); *H01B 5/14* (2013.01); *H01L 23/36* (2013.01)

(56) References Cited

U.S. PATENT DOCUMENTS

| | | | | |
|---|---|---|---|---|
| 2006/0125352 | A1* | 6/2006 | Sakashita | C23C 24/04 310/358 |
| 2009/0039477 | A1* | 2/2009 | Kaga | C04B 35/584 257/655 |
| 2013/0273189 | A1 | 10/2013 | Yamao et al. | |
| 2015/0028462 | A1 | 1/2015 | Hasegawa et al. | |
| 2016/0159648 | A1 | 6/2016 | Yamao et al. | |

FOREIGN PATENT DOCUMENTS

| | | | |
|---|---|---|---|
| JP | 06306611 A | * | 11/1994 |
| JP | 9-175900 A | | 7/1997 |
| JP | 10-245270 A | | 9/1998 |
| JP | 2000-114425 A | | 4/2000 |
| JP | 2002-190512 A | | 7/2002 |
| JP | 2002-239682 A | | 8/2002 |
| JP | 2003-218269 A | | 7/2003 |
| JP | 3784341 B2 | | 6/2006 |
| JP | 2006-188046 A | | 7/2006 |
| JP | 2005-314800 A | | 11/2006 |
| JP | 2007-109827 A | | 4/2007 |
| JP | 2007-305772 A | | 11/2007 |
| JP | 2008-111154 A | | 5/2008 |
| JP | 2008-285339 A | | 11/2008 |
| JP | 2011-222551 A | | 11/2011 |
| JP | 2013-71864 A | | 4/2013 |
| JP | 5245405 B2 | | 7/2013 |
| JP | 2015-45085 A | | 3/2015 |
| WO | WO 2006/118003 A1 | | 11/2006 |
| WO | WO 2012/090543 A1 | | 7/2012 |
| WO | WO 2015/005390 A1 | | 1/2015 |

OTHER PUBLICATIONS

Zhu et al., "Textured silicon nitride: processing and anisotropic properties", Sci. Technol. Adv. Mater., 9 (Year: 2008).*
Xu et al., "New Strategies for Preparing NanoSized Silicon Nitride Ceramics", J. Am. Ceram. Soc., 88[4] 934-937 (Year: 2005).*
Hirao et al., "Microstructure Control of Silicon Nitride by Seeding with Rodlike β-Silicon Nitride Particles", J. am. Ceram. Soc., 77[7] 1857-62 (Year: 1994).*
"Fine-Grained Silicon Nitride Ceramics Prepared from β-Powder", J. Am. Ceram. Soc., 78[1] 211-14 (1995) (Mitomo) (Year: 1995).*
"Microstructural design and mechanical properties of porous silicon nitride ceramics", Materials Science and Engineering A, vol. 498, pp. 5-11 (2008) (Ohji) (Year: 2008).*
"Textured silicon nitride: processing and anisotropic properties", Sci. Technol. Adv. Mater., 9 (2008) (Zhu) (Year: 2008).*
"New Strategies for Preparing NanoSized Silicon Nitride Ceramics", J. Am. Ceram. Soc., 88[4] 934-937 (2005) (Xu) (Year: 2005).*
"Microstructure Control of Silicon Nitride by Seeding with Rodlike β-Silicon Nitride Particles", J. am. Ceram. Soc., 77[7] 1857-62 (1994) (Hirao) (Year: 1994).*
International Preliminary Report on Patentability and Written Opinion of the International Searching Authority (forms PCT/IB/373, PCT/ISA/237 and PCT/IB/326), dated Sep. 13, 2018, for corresponding International Application No. PCT/JP2017/007981, with translation of the Written Opinion.
International Search Report (form PCT/ISA/210), dated Mar. 28, 2017, for corresponding International Application No. PCT/JP2017/007981, with an English translation.
Taiwanese Office Action and Search Report, dated Nov. 22, 2017, for corresponding Taiwanese Application No. 106106636.
Extended European Search Report, dated Oct. 7, 2019, for corresponding European Application No. 17760036.8.
Chinese Office Action, dated Apr. 3, 2020, for corresponding Chinese Application No. 201780014535.6, along with an English translation.

* cited by examiner

CERAMIC LAMINATE

FIELD

The present invention relates to a ceramic laminate having a ceramic film formed on a metal layer and having excellent mechanical properties, anti-reactivity, heat resistance, insulating property and heat dissipation property. The present invention particularly relates to an insulative heat dissipating body used for semiconductor devices.

BACKGROUND

Ceramic laminates in which ceramics having excellent mechanical properties, anti-reactivity, heat resistance, insulation property, heat dissipation property and the like are formed on metal are widely used for a wear-resistant member (transporting/rolling rolls, cutting tools, etc.), an anti-corrosion member, an insulative heat dissipating body and the like. Examples of ceramics used for such a ceramic laminate include aluminum oxide ($Al_2O_3$), aluminum nitride (AlN), silicon nitride ($Si_3N_4$), zirconium oxide ($ZrO_2$), silicon carbide (SiC), yttrium oxide ($Y_2O_3$), and the like.

Among these ceramics, silicon nitride, which has high strength and fracture toughness and is excellent in abrasion resistance, heat resistance, heat dissipation property and insulation property, is used for engine and gas turbine materials, cutting tools, bearing balls, and an insulative heat dissipating body for semiconductor devices, and the like. Ceramics such as silicon nitride are generally produced by sintering a raw material powder at a high temperature. However, since crystal grains grow due to high-temperature heating during sintering, it is difficult to obtain a fine crystal structure, and a possibility of a decrease in strength may increase due to the occurrence of a void that can serve as a crack initiation point. In addition, there is a possibility that insulating property is lowered due to generation of voids and decrease in the number of grain boundaries. Further, in sintering ceramics, a sintering aid is often added to promote densification, and these sintering aids form a grain boundary phase (second phase) in addition to the intended ceramics phase in the sintered body, which may lower mechanical properties, heat dissipation property, insulation property, heat resistance, anti-reactivity and the like. In particular, silicon nitride is regarded as a hard-to-sinter ceramics which is particularly difficult to be sintered among various ceramics, and a sintering aid such as silicon oxide ($SiO_2$), magnesium oxide (MgO), yttrium oxide, aluminum oxide or the like must be added. Otherwise, it is impossible to obtain a dense sintered body without voids, and thus the formation of a grain boundary phase derived from a sintering aid is inevitable.

Therefore, if a dense silicon nitride having a fine structure can be made without forming a grain boundary phase can be produced, it is possible to obtain a ceramic laminate having excellent mechanical properties, heat dissipation property, insulation property, heat resistance and anti-reactivity, and the resulting ceramic laminate can be used for the wear resistant member (transporting/rolling rolls, cutting tools, etc.), anti-corrosion member, insulative heat dissipating body and the like as described above.

One of applications to which silicon nitride is applied is an insulative heat dissipating body used for a semiconductor device. Conventional insulative heat dissipating bodies used are made of an insulative ceramic substrate having a metal plate joined thereto. Normally, a ceramic substrate is obtained by sintering at 1000° C. or higher, a ceramic substrate formed into a sheet shape by the doctor blade method. As a material of the ceramic substrate, in addition to aluminum oxide which is excellent in insulating property, high in strength and excellent in thermal conductivity, aluminum nitride which is superior in thermal conductivity to aluminum oxide, and furthermore, silicon nitride having a higher strength as compared to aluminum oxide and aluminum nitride is usually used. Generally, the thickness of such a ceramic substrate is 0.2 to 0.6 mm in consideration of insulation property, strength, thermal conductivity and the like.

Copper (Cu) is frequently used as a metal plate because it is excellent in thermal conductivity and is inexpensive. Aluminum (Al) which is inferior to copper in thermal conductivity but soft, is also used.

In order to bond the ceramic substrate and the metal plate to each other, many methods are used such as an active metal method (AMB (Active Metal Brazing) method using a brazing material), or a direct bonding method in which the ceramic substrate and the copper plate (metal plate) are joined directly to each other, for example, utilizing an eutectic reaction of copper and oxygen (Direct Copper Bonding (DCB) method). However, since both methods use 800° C. or higher for bonding, there is a problem that a thermal stress caused by the difference in thermal expansion coefficient between the ceramic substrate and the metal plate is generated.

As compared with aluminum oxide and aluminum nitride, silicon nitride generally has high strength and fracture toughness and is excellent in thermal cycle reliability. Therefore, it is used as an insulative heat dissipating body for a semiconductor module, in particular, a module which is exposed to an atmosphere at high temperature and under a severe thermal cycle condition. However, since its difference in thermal expansion coefficient with metal is larger than that of aluminum oxide or aluminum nitride, a conventional insulative heat dissipating body (hereinafter also referred to as "a sintered heat dissipating body") in which a ceramic substrate made of silicon nitride is bonded onto a metal plate at 800° C. or higher will have a high residual thermal stress generated by high-temperature heating at the time of bonding. When the insulative heat dissipating body made of silicon nitride in which such a residual thermal stress is generated, is placed under thermal cycling and further exposed to repeated thermal stress, a thermal cycling reliability expected from the strength and the fracture toughness of silicon nitride may not be obtained in some cases.

Further, in the sintered heat dissipating body of silicon nitride produced by using the sintering method, a sintering aid such as silicon oxide, magnesium oxide, yttrium oxide, aluminum oxide or the like is added to a ceramics substrate to promote densification during sintering. In this case, a grain boundary phase derived from the sintering aid is formed in the ceramic substrate, and there are cases in which the mechanical properties, heat dissipating property and insulation property may be deteriorated in some cases. In addition, due to grain growth of the crystal during sintering, voids tend to be formed, and mechanical properties and insulation property may be impaired in some cases.

As a method for solving this problem, an aerosol deposition method in which ceramic particles are made to collide with a metal plate and a dense ceramic film having no grain boundary phase derived from a sintering aid is formed directly on a metal plate surface at a normal temperature is disclosed in Patent Documents 1, 2 and 3.

Further, for an insulative heat dissipating body obtained by bonding a metal plate to a ceramic substrate produced by a conventional sintering method, a technique for improving thermal cycle reliability and heat dissipation property by controlling the mechanical characteristics and thermal characteristics of the sintered ceramic substrate is disclosed in Patent Documents 4 and 5.

However, Patent Document 1 merely discloses an aerosol deposition method using aluminum oxide as a working example, but does not disclose an aerosol deposition method using other ceramics.

In addition. Patent Document 2 discloses a ceramic laminate material made of aluminum oxide whose crystal orientation is controlled as a texture feature of a film produced by an aerosol deposition method, but it only discloses that a (001) plane of aluminum oxide whose surface energy is low is oriented to be parallel to the surface of the ceramic laminate material to use it as a constituent material of an anticorrosive film and a cutting tool.

In addition, Patent Document 3 discloses a semiconductor device in which silicon oxide, aluminum oxide, silicon nitride, boron nitride, or aluminum nitride is used to form an insulating layer by an aerosol deposition method. However, film formation conditions of the aerosol deposition method of the various ceramics are not disclosed, and crystal structure features including crystal grain size and crystal orientation are not disclosed, either.

For other ceramics, there are some reported examples using the aerosol deposition method. However, the fabrication method by the aerosol deposition method has not yet been established for all the ceramics, and their characteristics are not known at all.

Patent Documents 4 and 5 related to a conventional sintered heat dissipating body disclose a density, a crystal grain size, a crystal orientation, and the like in a sintered silicon nitride substrate. By controlling these parameters, mechanical properties and thermal properties of the substrate were tried to be controlled. However, due to production by the sintering method, a grain boundary phase derived from a sintering aid is contained in the substrate, and the crystal becomes coarse due to the grain growth during sintering. As a result, it is difficult to achieve a high withstand voltage. Regarding bonding with the metal plate, it is presumed that a residual thermal stress has occurred since bonding is made by high temperature heating using a brazing material.

PRIOR ART DOCUMENT

Patent Document

[PATENT DOCUMENT 1] Japanese Patent No. 3784341
[PATENT DOCUMENT 2] Japanese Unexamined Patent Publication (Kokai) No. 2015-45085
[PATENT DOCUMENT 3] Japanese Unexamined Patent Publication (Kokai) No. 2007-305772
[PATENT DOCUMENT 4] Japanese Unexamined Patent Publication (Kokai) No. 2000-114425
[PATENT DOCUMENT 5] Japanese Patent No. 5245405

SUMMARY

Problem to be Solved by the Invention

The present invention has been made in view of the above problems, and it is an object of the present invention to provide a ceramic laminate having excellent mechanical properties, heat dissipation property, insulation property, heat resistance and anti-reactivity, and particularly to provide an insulative heat dissipating body having an excellent thermal cycle reliability, and a high withstand voltage.

Means for Solving the Problem

The summary of the present invention is as follows.

(1) A ceramic laminate in which a ceramic film is formed on a metal layer, wherein the ceramic film has a minimum film thickness of 1 µm or more, contains silicon nitride and inevitable impurities, and has silicon nitride crystal grains having an average grain size of 300 nm or less in the film thickness direction and an average grain size of 500 nm or less in the in-plane direction.

(2) The ceramic laminate according to item (1), wherein the ceramic film has a porosity of less than 3%.

(3) The ceramic laminate according to item (1) or (2), wherein the ceramic film has a minimum film thickness at least 1.5 times larger than a maximum height roughness of the metal layer.

(4) The ceramic laminate according to any one of items (1) to (3), wherein the ceramic film has silicon nitride crystal grains having an average grain size of 150 nm or less in the film thickness direction and an average grain size of 250 nm or less in the in-plane direction.

(5) The ceramic laminate according to item (4), wherein the ceramic film has silicon nitride crystal grains having an average grain size of 100 nm or less in the film thickness direction and an average grain size of 150 nm or less in the in-plane direction.

(6) The ceramic laminate according to any one of items (1) to (5), wherein the ceramic film contains silicon nitride whose proportion of β-silicon nitride in the silicon nitride exceeds 50 wt %, and inevitable impurities.

(7) The ceramic laminate according to item (6), wherein the ceramic film has a ratio of the X-ray diffraction intensity I (210) of (210) plane to the X-ray diffraction intensity I (101) of (101) plane of the β-silicon nitride crystal exceeding 0.9.

(8) The ceramic laminate according to item (7), wherein the ceramic film has a ratio of the X-ray diffraction intensity I (210) of (210) plane to the X-ray diffraction intensity I (101) of (101) plane of the β-silicon nitride crystal exceeding 2.2.

(9) The ceramic laminate according to any one of items (1) to (5), wherein the ceramic film contains silicon nitride whose proportion of α-silicon nitride in the silicon nitride exceeds 50 wt %, and inevitable impurities.

(10) The ceramic laminate according to any one of items (1) to (9), wherein the ceramic film has silicon nitride crystal grains having an average aspect ratio of smaller than 2.0 when viewed in the film thickness direction.

(11) An insulative heat dissipating body characterized by being composed of the ceramic laminate according to any one of items (1) to (10).

(12) The insulative heat dissipating body according to item (11), wherein the minimum film thickness of the ceramic film is 10 µm or more and 100 µm or less.

(13) The insulative heat dissipating body according to item (11) or (12), wherein the metal layer is made of copper or aluminum.

(14) The insulative heat dissipating body according to any one of items (11) to (13), wherein a metal circuit is formed on the ceramic film.

(15) The insulative heat dissipating body according to item (14), wherein the metal circuit is made of copper or aluminum.

Effect of the Invention

By the present invention, it is possible to realize a ceramic laminate having excellent mechanical properties, heat dissipating property, insulative property, heat resistance and anti-reactivity, in particular, an insulative heat dissipating body having excellent thermal cycle reliability and high withstand voltage, by using silicon nitride excellent in strength and fracture toughness to form a ceramic film and make the ceramic film have the morphology of the present invention,

DESCRIPTION OF EMBODIMENTS

Figure 1:
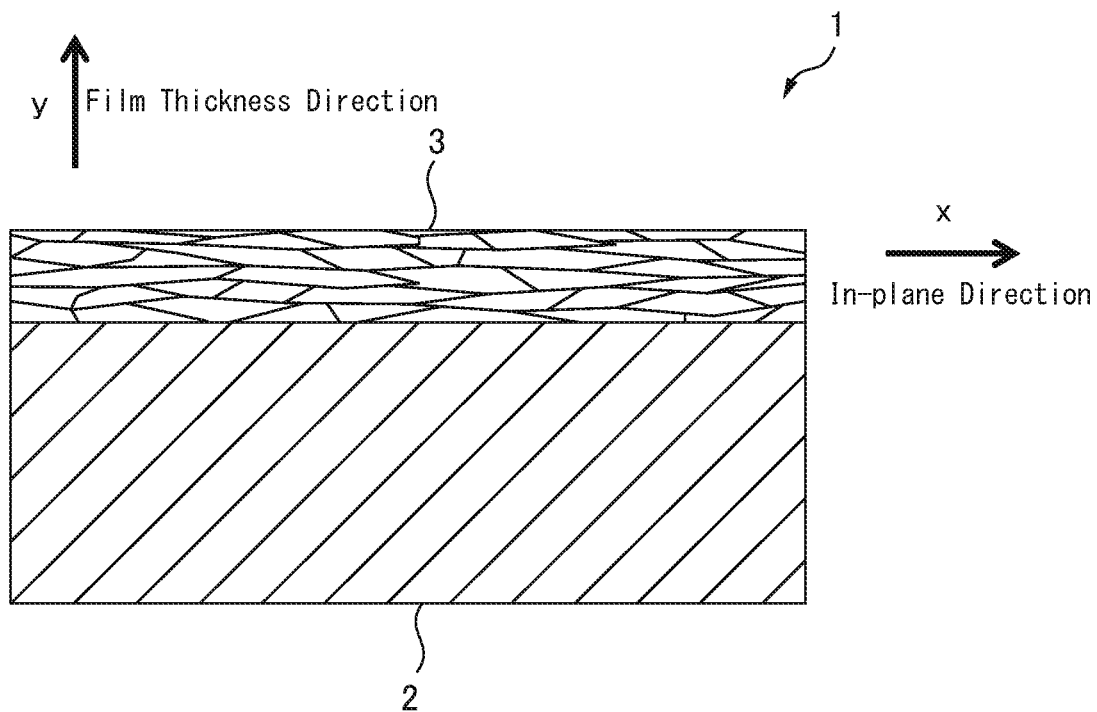
FIG. 1 is a cross-sectional view showing a configuration of a ceramic laminate of the present invention.

FIG. 1 is a cross-sectional view of a ceramic laminate 1 of the present invention. The ceramic laminate 1 of the present invention has a configuration in which a ceramic film 3 is formed on a metal layer 2 which is a substrate. For example, in the case of an insulative heat dissipating body, the metal layer 2 is in the form of a plate having a thickness of several millimeters and has a structure in which the ceramic film 3 is provided only on one surface of the metal layer. In the case of a conveying and rolling roll, the metal layer 2 has a columnar or cylindrical shape, and has a structure in which a ceramic film 3 is provided on the outer peripheral surface thereof. When the metal layer 2 has a columnar or cylindrical shape, FIG. 1 shows a cross section in the axial direction of the column or cylinder.

The ceramic film 3 is formed to have a minimum film thickness of 1 µm or more. Here, the film having a minimum film thickness of 1 µm or more means that when the film thickness is measured in the film thickness direction (the direction normal to the film surface of the ceramic film 3) along the cross section of the ceramic film 3 in the direction perpendicular to the film surface, the film thickness of the portion of the ceramic film 3 having the smallest film thickness (the minimum film thickness portion 4 in FIG. 2) is 1 µm or more, and by a simple insulation measurement by a tester, all of 5 or more points of the film surface shows over range (it is impossible to display in MO). In other words, this means that the metal layer is not exposed on the surface, and the ceramic laminate is provided with necessary characteristics such as insulation property according to the intended use in the required regions of the metal layer. However, in using the ceramic laminate of the present invention, portions where a complete coating of the metal layer is unnecessary may have a minimum film thickness of less than 1 µm, or the metal layer may be exposed in those portions. It is also possible to make the metal layer be exposed intentionally.

By setting the minimum film thickness of the ceramic film 3 to 1 µm or more, it is possible to obtain a ceramic laminate in which necessary characteristics such as insulating property according to the intended use is surely provided in the required regions of the metal layer. On the other hand, when the minimum thickness of the ceramic film 3 is less than 1 µm, there is a high possibility that the metal layer 2 is exposed on the surface of the laminate, and thus the metal layer cannot surely imparted with characteristics such as insulation property. In addition, in order to prevent variations in characteristics depending on places, it is desirable that the maximum film thickness of the ceramic film 3 is not more than twice the minimum film thickness. Here, the maximum film thickness refers to a film thickness at a point where the film thickness of the ceramic film 3 is the largest (the maximum film thickness portion 5 of FIG. 2) when the film thickness of the ceramic film 3 is measured in the film thickness direction along the cross section of the ceramic film 3 in the direction perpendicular to the film surface.

The ceramic film 3 is composed of silicon nitride and inevitable impurities. In the cross section of the ceramic film 3 in the direction perpendicular to the film surface, the ratio of the area occupied by the silicon nitride in the ceramic film excluding the voids is 90% or more, and preferably 95% or more, the remainder being composed of inevitable impurities which may be contained in raw materials, such as iron (Fe), aluminum (Al), calcium (Ca), oxides, and inevitable impurities which may be incorporated during the manufacturing process. It is necessary to obtain the area ratio by observing the ceramic film of 300 µm$^2$ or more excluding the voids, using FE-SEM (Field Emission-Scanning Electron Microscope).

In addition, the ceramic film 3 is a dense film formed in nano-order, such that silicon nitride crystal grains have an average grain size of 300 nm or less in the film thickness direction (normal direction to the film surface of the ceramic film 3) y, and an average grain size of 500 nm or less in the in-plane direction x. Therefore, it is expected that there will be few voids which may become initiation points of cracks, and the film has high strength. In addition, since the silicon nitride crystal grains have a dense lamella structure extending in the in-plane direction (the direction of the film surface) x, crack propagation in the film thickness direction y is suppressed by the crack deflection and extraction effect. Furthermore, since the grain boundary of the ceramic film 3 has a bond between silicon nitride crystals, the resistance of crack propagation at the grain boundary can be made larger than in the case where the grain boundary phase derived from the conventional sintering aid exists. From the above, the ceramic film of the ceramic laminate of the present invention can have excellent strength and fracture toughness. In particular, in the case where the ceramic laminate is used as an insulative heat dissipating body, it is possible to suppress cracks and their propagation generated in the ceramic membrane 3 due to thermal stress caused by repeated thermal cycles. As a result, thermal cycle reliability of the ceramic laminate may be improved.

In addition, the ceramic film 3 does not contain a grain boundary phase derived from a sintering aid which has detrimental effects on mechanical properties, heat dissipation property, heat resistance and anti-reactivity, as compared with a silicon nitride sintered body. Therefore, its mechanical properties, heat dissipation property, heat resistance and anti-reactivity can be improved.

In addition, the ceramic film 3 has no grain boundary phase derived from a sintering aid which has detrimental effects on insulation performance, as compared with a silicon nitride sintered body, and furthermore the ceramic film 3 is a dense film formed in nano-order, such that the silicon nitride crystal grains have an average grain size of 300 nm or less in the film thickness direction y, and an average grain size of 500 nm or less in the in-plane direction x. Therefore, the withstand voltage per unit length of the ceramic film 3 can be 100 to 300×$10^6$ V/m or more. The withstand voltage per unit length of the silicon nitride sintered body produced by the sintering method as in the prior art is about 20 to 30×$10^6$ V/m. Therefore, when the ceramic laminate of the present invention is used as an insulative heat dissipating body, the minimum film thickness of the ceramic film 3 can be reduced to at least ⅓ to 1/10 that of the silicon nitride sintered substrate, and the heat dissipating property can also be improved.

On the other hand, if the grain boundary phase derived from the sintering aid exists, the average grain size in the film thickness direction y is larger than 300 nm, and the average grain size in the in-plane direction x is larger than 500 nm, then it is impossible to expect improvement effects of strength, fracture toughness and withstanding voltage, as expected above.

Figure 3:
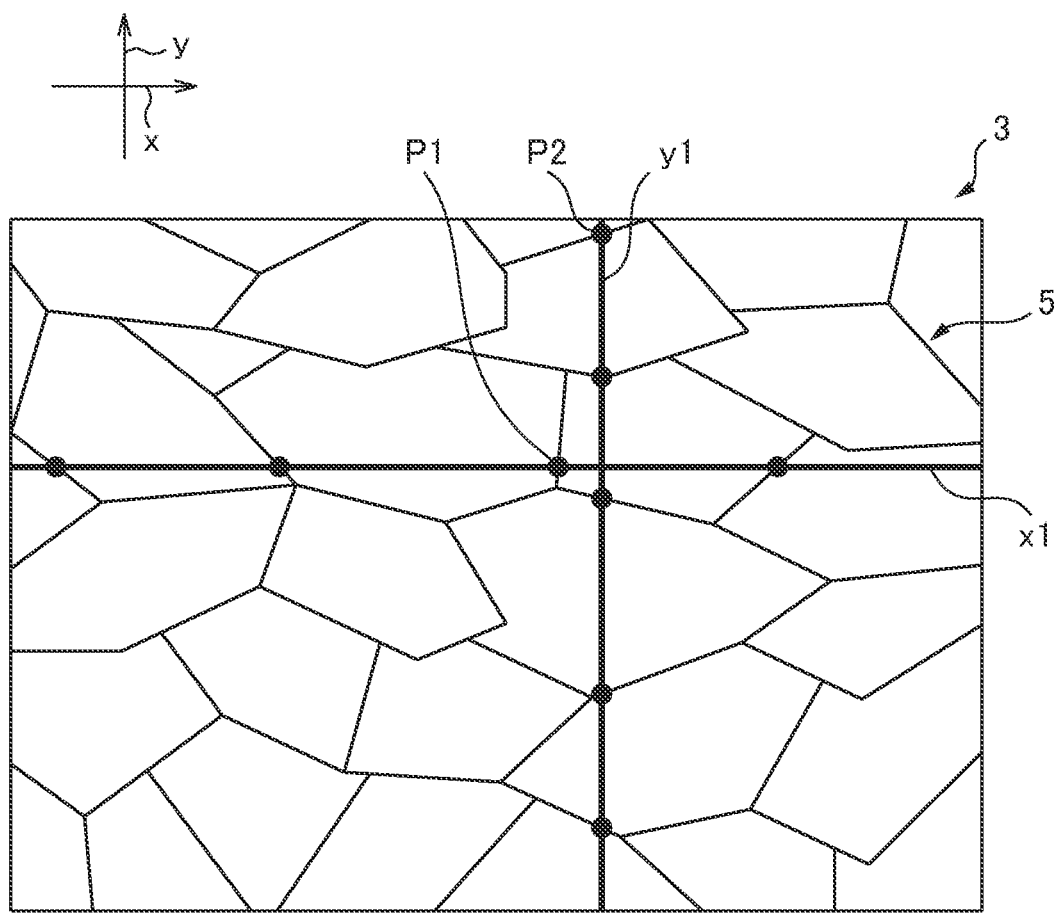
FIG. 3 is a schematic view for explaining a method of measuring an average grain size of silicon nitride crystal grains in a ceramic film.

Here, the average grain size is a value determined as follows. As shown in FIG. 3, a line segment y1 is drawn in the film thickness direction y along the cross section of the ceramic film 3 in the direction perpendicular to the film surface, and a line segment x1 is drawn in the in-plane direction x. The average grain size in the film thickness direction y is a value obtained by dividing the actual length of the line segment y1 by the number of intersection points P2 between the line segment y1 and the grain boundary 5. The average grain size in in-plane direction x is a value obtained by dividing the actual length of the line segment x1 by the number of intersection points P1 between the line segment x1 and the grain boundary 5. The average grain size can be determined by using FE-SEM at a magnification corresponding to the crystal grain size of silicon nitride (for example, about 5000 times magnification if the grain size is about 1000 nm, and about 50000 times magnification if the grain size is about 100 nm). It is necessary to observe at a plurality of locations so that the number of intersections P2 and P1 is 100 or more in total, respectively. It is necessary to obtain a value of the average grain size in the film thickness direction y and the average grain size in the in-plane direction x at each of the locations and then to average the resulting values at all locations.

The porosity of the ceramic film 3 may be smaller than 3% in the film. Therefore, the number of voids which can serve as crack initiation points is small, and high strength can be obtained. In addition, since there are few voids having a low withstand voltage, a high withstand voltage can be obtained. On the other hand, when the porosity is 3% or more, there is a possibility that the breaking strength and the withstand voltage will be lowered. Here, the porosity means the ratio of the area occupied by the voids in the ceramic film (including the void) along the cross section of the ceramic film 3 in the direction perpendicular to the film surface. It is necessary to obtain the porosity by observing a ceramic film of 300 μ$m^2$ or more in total using the FE-SEM.

Figure 2:
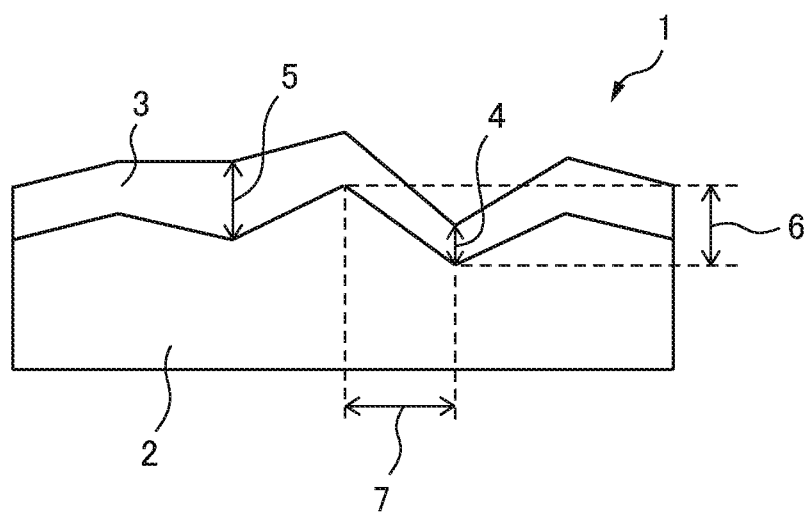
FIG. 2 is a schematic view showing an example of a measurement position of a minimum/maximum film thickness in a ceramic film and an example of a maximum height roughness of a metal layer.

It is desirable that the minimum thickness of the ceramic film 3 is at least 1.5 times, more preferably at least 3 times the maximum height roughness of the metal layer 2. Here, as shown in FIG. 2, the maximum height roughness of the metal layer means the maximum height difference 6 of the metal layer at the interface between the ceramic film 3 and the metal layer 2 in the cross section perpendicular to the film surface of the ceramic laminate 1. However, when measuring the maximum height difference 6, the distance 7 between the highest point and the lowest point of the metal layer in the in-plane direction is set to 20 μm or less. By setting the minimum film thickness of the ceramic film 3 to at least 1.5 times the maximum height roughness of the metal layer, the metal layer can surely have characteristics such as insulation property.

In addition, it is desirable that the ceramic film 3 is formed such that the silicon nitride crystal grains have an average grain size of 150 nm or less in the thickness direction and an average grain size of 250 nm or less in the in-plane direction, more preferably an average grain size of 100 nm or less in the film thickness direction and an average grain size of 150 nm or less. By making silicon nitride crystal grains small in the ceramic film 3 such that the silicon nitride crystal grains have an average grain size of 150 nm or less in the thickness direction and an average grain size of 250 nm or less in the in-plane direction, more preferably an average grain size of 100 nm or less in the film thickness direction and an average grain size of 150 nm or less in the in-plane direction, it is possible to further improve the strength, the fracture toughness and the withstand voltage.

In the silicon nitride, mainly a trigonal α phase (hereinafter also referred to as α-silicon nitride) and a hexagonal β phase (hereinafter also referred to as β-silicon nitride) are present. The ceramic film 3 of the present invention may be composed of silicon nitride mainly composed of β-silicon nitride and inevitable impurities. Here, this means that it is composed of silicon nitride whose the proportion of β-silicon nitride in the silicon nitride is higher than 50 wt %, and inevitable impurities. The proportion of β-silicon nitride is preferably greater than 60 wt %, more preferably greater than 70 wt %, even more preferably greater than 80 wt %, and even more preferably greater than 90 wt %. In this case, the remaining silicon nitride may be α-silicon nitride. Since β-silicon nitride has a simpler crystal structure than α-silicon nitride, the ceramic film 3 composed of β-silicon nitride and inevitable impurities is advantageous from the view point of high thermal conductivity and heat dissipation.

The ceramic film 3 provided on the ceramic laminate 1 of the present invention has a crystal structure, wherein the c-axis of the β-silicon nitride crystal is oriented in the in-plane direction x of the ceramic film 3.

Here, in the temperature range of 20 to 900° C., the thermal expansion coefficient in the c-axis direction of the β-silicon nitride crystal is 2.74×$10^{-6}$/° C. On the other hand, the thermal expansion coefficient in the a-axis direction which is the direction perpendicular to the c-axis direction is 2.24×$10^{-6}$/° C. In addition, the thermal expansion coefficient of the metal layer is generally larger than that of the ceramic film, as indicated by a value of about 17×$10^{-6}$/° C. with respect to copper. That is, since the c-axis having a large thermal expansion coefficient is oriented to the in-plane direction x in the ceramic film 3, it is possible to increase the thermal expansion coefficient of the ceramic film in the in-plane direction x and thus to reduce the difference in thermal expansion coefficients of the ceramic film and the metal layer 2 made of copper or the like, as compared to the film wherein the c-axis is not oriented or the c-axis is oriented in the film thickness direction y. As a result, the ceramic laminate 1 of the present invention may have an improved durability against temperature change. In particular, when the ceramic laminate is used as an insulative heat dissipating body, thermal stress repeatedly caused by a difference in thermal expansion between the metal layer 2 and the ceramic film 3 when placed under thermal cycling is reduced. Therefore, a thermal cycling reliability of the laminate is improved.

Here, the β-silicon nitride crystal has a plane in which (210) plane is parallel to the c-axis and (101) plane is inclined to the perpendicular direction to c-axis as compared to (210) plane. In the case of a general non-oriented β-silicon nitride powder, the ratio of the X-ray diffraction intensity I (210) of (210) plane to the X-ray diffraction intensity I (101) of (101) plane is 0.9. That is, in the present invention, in the case of the ceramic film 3 in which the c-axis of the β-silicon nitride crystal is oriented to the in-plane direction x, the ratio of the X-ray diffraction intensity I (210) of (210) plane to the X-ray diffraction intensity I (101) of (101) plane, obtained by measuring the X-ray diffraction pattern of the surface of the ceramic film 3 may be higher than 0.9, and is preferably not less than 2.2.

In the ceramic film 3, the ratio of the X-ray diffraction intensity I (210) of (210) plane to the X-ray diffraction intensity I (101) of (101) plane of the β-silicon nitride crystal is set to a value exceeding 0.9. By doing so, it is possible to reduce the difference in thermal expansion between the metal layer 2 and the ceramic film 3. In addition, if it is set to a value less than 2.2, the difference in thermal expansion between the metal layer 2 and the ceramic film 3 can be further reduced.

The ceramic film 3 of the present invention may be composed of silicon nitride mainly composed of α-silicon nitride and inevitable impurities. This means that it is composed of silicon nitride whose proportion of α-silicon nitride in the silicon nitride exceeds 50 wt %, and inevitable impurities. The proportion of α-silicon nitride is preferably greater than 60 wt %, more preferably greater than 70 wt %, even more preferably greater than 80 wt %, and even more preferably greater than 90 wt %. In this case, the remaining silicon nitride can be β-silicon nitride. Compared to β-silicon nitride, α-silicon nitride has many variations in purity and grain size among commercially available powders, and it is easy to obtain a raw material powder with a high purity and a grain size optimum for manufacturing a ceramic laminate, and thus easy to manufacture a desired ceramic laminate. In particular, when an aerosol deposition method is used as a method for producing a ceramic laminate, a good quality film cannot be obtained by using a commercially available α-silicon nitride powder or β-silicon nitride powder without preconditioning. However, since α-silicon nitride has many variations in purity and grain size, it is easier to obtain more optimum raw material powder of α-silicon nitride, as compared to β-silicon nitride, which has less variations. As a result, it is possible to obtain a high-quality film with fewer preconditioning steps.

Figure 4:
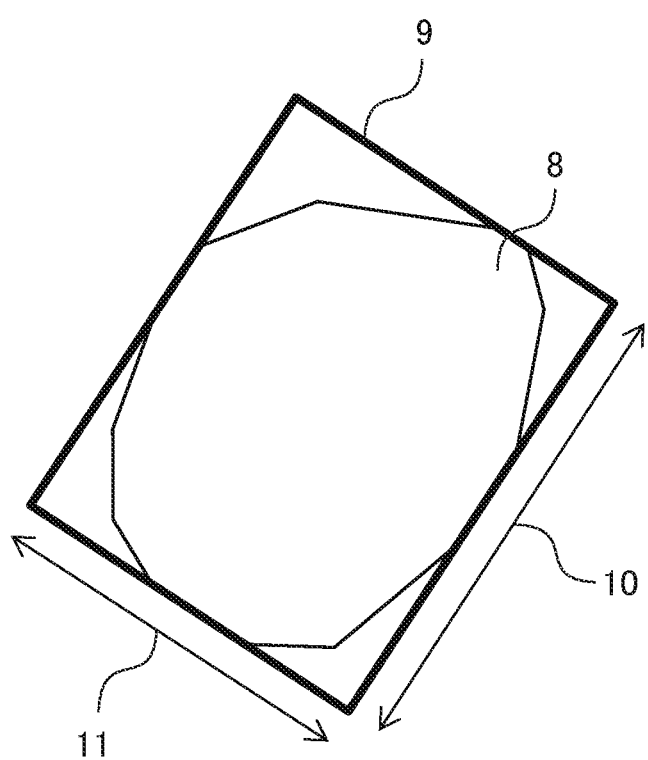
FIG. 4 is a schematic view for explaining a method of measuring an average aspect ratio of silicon nitride crystal grains in a ceramic film.

Further, the ceramic film 3 may have an average aspect ratio of silicon nitride crystal grains of less than 2.0 when viewed from the film thickness direction. Therefore, as compared with a silicon nitride sintered body in which a large number of silicon nitride crystal grains having a high aspect ratio exist on the surface due to grain growth during sintering, there is a low possibility that voids and grain boundary phases exist between the crystal grains. Therefore, variations in various characteristics such as electrical characteristics and thermal characteristics at the surface can be reduced. Here, as shown in FIG. 4, the aspect ratio means the value obtained by dividing a longitudinal axis size 10 by a short axis size 11, wherein the longitudinal axis size 10 is a longitudinal length (maximum scissor size) and the short axis size is a lateral length of rectangle 9, in which the rectangle 9 circumscribes silicon nitride crystal grains 8 such that the longitudinal length becomes maximum length in a cross section in a direction parallel to the film surface of the ceramic film. Calculation of the average aspect ratio can be performed by observation by FE-SEM at a magnification corresponding to the crystal grain size of silicon nitride (for example, about 5000 times magnification if the grain size is about 1000 nm, and about 50000 times magnification if the grain size is about 100 nm). For calculation, it is necessary to select at least 100 crystal grains whose grain boundaries can be discerned and to average the aspect ratios of each of the crystal grains.

The ceramic laminate 1 of the present invention can be used as an insulative heat dissipating body for semiconductor devices. In this case, the metal layer 2 serves as a heat sink. In addition, the ceramic film 3 desirably has a minimum film thickness of 200 μm or less, more preferably 150 μm or less, so as to impart better heat dissipation property as compared to a conventional sintered ceramic substrate.

The ceramic laminate 1 of the present invention may have a withstand voltage per unit length of the ceramic film 3 of 100 to 300×10$^6$ V/m or more, as described above. Thus, in the case where the ceramic laminate is used as an insulative heat dissipating body, even when the minimum thickness of the ceramic film 3 is 10 μm, it is possible to secure a withstand voltage of several kV which is generally required as an insulative heat dissipating body. The minimum film thickness of the ceramic film 3 is desirably 10 μm or more from the view point of the withstand voltage generally required for an insulative heat dissipating body. Further, it is desirable that the ceramic film 3 has a minimum film thickness of 100 μm or less. By setting the minimum film thickness of the ceramic film 3 to 100 μm or less, an increase in thermal resistance can be suppressed. Further, by setting the minimum film thickness of the ceramic film 3 to 100 μm or less, warping of the metal layer is less likely to occur, and a thin metal layer or a soft metal layer can also be used.

When the ceramic laminate 1 of the present invention is used as an insulative heat dissipating body, a metal circuit for mounting a semiconductor chip may be formed on the ceramic film 3 formed on the metal layer 2.

Incidentally, it is preferred that a metal layer 2 which plays a role of a heat sink, and a metal circuit formed on the ceramic film 3 on the metal layer 2 and for mounting a semiconductor chip are mainly composed of copper or aluminum for conducting heat and electricity. Here, the term "mainly composed of" refers to one containing copper or aluminum by 50 wt % or more based on the mass of the entire composition constituting the base material layer. From the view point of thermal conductivity and electric conductivity, copper or aluminum is preferably pure copper or pure aluminum with little impurities, but for strength or other reasons, the base material layer is mainly composed of copper or aluminum, and may contain as the remainder, different metals other than copper and aluminum as long as its thermal conductivity and electric conductivity is not remarkably impaired.

Next, a method for producing the ceramic laminate of the present invention will be described. The method of manufacturing the ceramic laminate of the present invention includes a PVD (Physical Vapor Deposition) method, a CVD (Chemical Vapor Deposition) method, a thermal spraying method, and the like. Although the method is not limited thereto, for example, an aerosol deposition method in which a ceramics film is formed by colliding a mixture of ceramic particles and a gas to a surface of the metal layer is preferred, since a dense ceramic film having a fine structure without a grain boundary phase derived from a sintering aid may be produced on a metal layer at room temperature without a bonding layer on the metal layer. Hereinafter, the aerosol deposition method will be described as an example.

Figure 5:
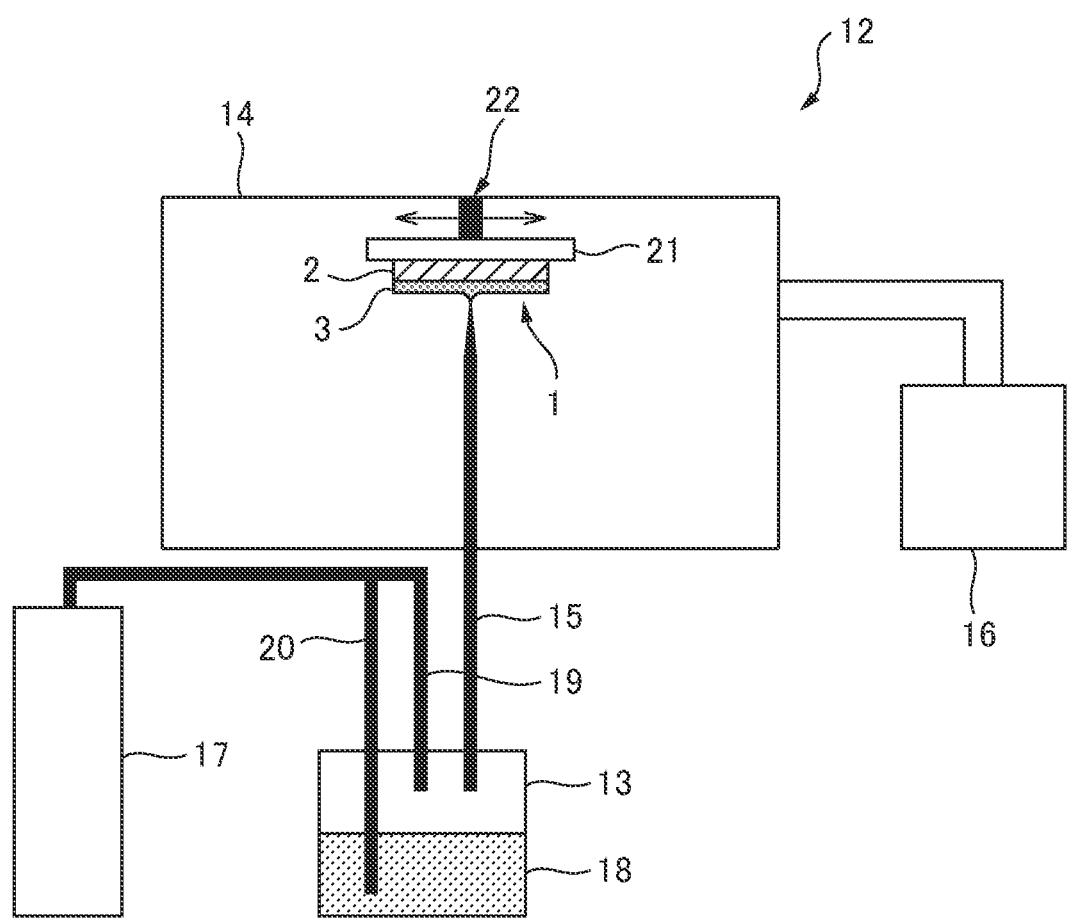
FIG. 5 is a schematic view showing an example of an aerosol deposition device for manufacturing a ceramic laminate of the present invention.

The ceramic laminate 1 of the present invention is manufactured using the aerosol deposition device 12 exemplified in FIG. 5. The aerosol deposition device 12 in FIG. 5 comprises an aerosol-generating container 13, a deposition chamber 14, an aerosol transport pipe 15, a vacuum pump 16, and a gas supply system 17. The aerosol-generating container 13 and the deposition chamber 14 are connected to each other by the aerosol transport pipe 15. The vacuum pump 16 is connected to the deposition chamber 14 and can reduce a pressure in the deposition chamber 14. The gas supply system 17 and the aerosol-generating container 13 are connected to each other by a carrier gas pipe 19 and an aerosol-generating gas pipe 20.

In the aerosol-generating container 13, the silicon nitride powder 18 is contained inside the container. $N_2$ gas or He gas can be supplied as an aerosol-generating gas into the silicon nitride powder 18 from the aerosol-generating gas pipe 20. $N_2$ gas or He gas can also be supplied as a carrier gas into the container internal space from the carrier gas pipe 19. Incidentally, the aerosol-generating container 13 is provided with a vibration mechanism (not shown) for agitating the silicon nitride powder 18 and a heating mechanism (not shown) for drying the silicon nitride powder 18.

In the deposition chamber 14, a substrate fixing surface of stage 21 is provided so as to be opposed to a nozzle port of the aerosol transport pipe 15, and the metal layer 2 can be fixed to the substrate fixing surface. The stage 21 is provided with a horizontal drive mechanism 22 for forming the ceramic film 3 on the entire metal layer 2.

In the aerosol deposition device 12 having the above configuration, $N_2$ gas or He gas is supplied from the gas supply system 17 into the aerosol-generating container 13 through the aerosol-generating gas pipe 20 to generate an aerosol containing the silicon nitride powder in the aerosol-generating container 13. The aerosol deposition device 12 supplies the aerosol in the aerosol-generating container 13 to the deposition chamber 14 through the aerosol transport pipe 15 with $N_2$ gas or He gas supplied through the carrier gas pipe 19.

In the deposition chamber 14, an aerosol can be injected from the nozzle port of the aerosol transport pipe 15 toward the metal layer 2 fixed to the stage 21 in the chamber reduced in pressure by the vacuum pump 16. At this time, the stage 21 reciprocates in the horizontal direction by the horizontal drive mechanism 22, and the aerosol injected from the nozzle port of the aerosol transport pipe 15 is uniformly blown onto the entire surface of the metal layer 2.

The aerosol deposition device 12 ejects the aerosol onto the surface of the metal layer 2. The aerosol makes the silicon nitride powder collide with the metal layer 2, thereby crushing and deforming the particles of the silicon nitride powder by kinetic energy. In this manner, in the aerosol deposition device 12, the silicon nitride crystal is densified, and the ceramic film 3 in which the silicon nitride crystals are bonded to each other by forming a newly formed surface can be uniformly formed on the metal layer 3.

In film formation by the aerosol deposition method using the aerosol deposition device 12, there are optimum film formation conditions for each of film forming materials. Among them, in particular, the effects of a grain size of a raw material powder and a flow velocity of a film forming gas are large. A film formation phenomenon may not occur unless a raw material powder having an optimum grain size is used and a film is formed at an optimum gas flow velocity. For example, when the grain size is too large, or when the gas flow velocity is too large, the metal layer 2 is scraped off as in sand blasting, and thus film formation does not occur. When the grain size is too small or the gas flow velocity is too small, the powder particles follow the gas, the powder particles do not collide with the metal layer 2, and thus film formation does not occur.

In particular, covalent crystals such as silicon nitride generally have stronger interatomic bonds than ion-bonding crystals such as aluminum oxide. Therefore, when the powder particles collide with the metal layer 2, scraping phenomenon of the metal layer is likely to occur. As a result, silicon nitride has a small range of an optimum raw material grain size and gas flow velocity at which a film formation phenomenon occurs. For example, a film formation phenomenon has been reported using aluminum oxide as a raw material powder having from a small grain size of about 0.1 μm to a large grain size of about 3 μm. On the other hand, a filming phenomenon of silicon nitride could not occur using a raw material powder having a grain size of about 3 μm. Therefore, it is more difficult to deposit silicon nitride than a ceramic material such as aluminum oxide with a film formation by the aerosol deposition method which has already been reported. In particular, it can be said that it is difficult to form a film as described in the present invention.

For example, in the aerosol deposition device 12, when a gas flow velocity is 333 m/s wherein the gas flow velocity is a value resulting from the gas flow rate divided by the area of the nozzle orifice, and the grain size (median size) of the silicon nitride powder contained in the aerosol is more than 0.5 μm, the metal layer 2 may be scraped off upon spraying the aerosol onto the surface of the metal layer 2. On the other hand, when the grain size of the silicon nitride powder contained in the aerosol is less than 0.2 μm, the powder particles hardly collide with the surface of the metal layer 2, and thus it is difficult to form the ceramic film 3. In the case of using a silicon nitride powder having a grain size of 0.8 if the gas flow velocity exceeds 167 m/s, there is a possibility that the metal layer 2 is scraped upon spraying the aerosol onto the surface of the metal layer 2. On the other hand, when the gas flow velocity is less than 56 m/s, powder particles hardly collide with the surface of the metal layer 2, and thus it is difficult to form the ceramic film 3.

Therefore, in the present invention, it is desirable to use a silicon nitride powder having a grain size of 0.2 μm or more and 0.5 μm or less as the raw material powder, when the gas flow velocity is 333 m/s, so that the metal layer 2 is not scraped when the silicon nitride powder collides with the metal layer 2, and the silicon nitride powder does not follow the flowing gas and is allowed to collide with the metal layer 2 in order to crush and deform the silicon nitride powder. When a silicon nitride powder having a grain size of 0.8 μm is used, it is desirable that the gas flow velocity is 56 m/s or more and 167 m/s or less. It is desirable to use $N_2$ gas or He gas as an aerosol-generating gas and a carrier gas used for generating an aerosol. More preferably, He gas is used. When He gas is used, due to its low ionization voltage, a plasma is likely to be generated at the time of forming the ceramic film 3, and a fine and dense ceramic film 3 is likely to be formed due to the sputtering effect of the particles of the silicon nitride powder by the plasma.

As described above, if the ceramic film 3 is formed by using a silicon nitride powder having an optimum grain size and an optimal gas flow velocity, upon spraying an aerosol toward the metal layer 2, the silicon nitride powder is refined and densified such that a dense ceramic film 3 can be formed, the film having a minimum film thickness of 1 μm or more, having a porosity of 3% and having a crystal structure in which the silicon nitride crystal grain has an average grain size of 300 nm or less in the film thickness direction y, and an average grain size of 500 nm or less in the in-plane direction x. Further, since the metal layer 2 is not significantly scraped off, it is possible to form a ceramic film 3 of which the minimum film thickness is at least 1.5 times the maximum height roughness of the metal layer.

Also, in the case where the silicon nitride of the ceramic film is β-silicon nitride, when the aerosol is sprayed toward the metal layer 2, the c-axis parallel plane of the β-silicon nitride crystal preferentially slides and the c-axis parallel planes overlap on the metal layer, and thus the c axis of the β-silicon nitride crystal can be oriented in the in-plane direction x. On the other hand, when both the grain size of the β-silicon nitride powder and the gas flow velocity are not appropriate, the above-mentioned orientation does not occur because the β-silicon nitride powder is hardly miniaturized.

Thereby, the ratio of the X-ray diffraction intensity I (210) of (210) plane to the X-ray diffraction intensity I (101) of (101) plane of β-silicon nitride crystal can also be larger than 0.9. Here, when the ceramic film 3 is formed using the aerosol deposition device 12, and if, for example, a β-silicon nitride powder having a grain size of 0.8 μm is used to form a film at a gas flow velocity of 167 m/s, the ratio of the X-ray diffraction intensity I (210) of (210) plane to the X-ray diffraction intensity I (101) of (101) plane of β-silicon nitride crystal can be a value exceeding 0.9.

In addition, when the ceramic film 3 is formed on the metal layer 2 at room temperature by the aerosol deposition method, since the conventional high temperature process is not performed at the time of production, columnarization of crystal grains by grain growth (high aspect) does not occur. Thus, the average aspect ratio of the silicon nitride crystal grains viewed from the film thickness direction can be made smaller than 2.0. Also, due to the absence of high-temperature process, no residual thermal stress due to thermal expansion difference as compared to the metal is generated.

Here, when a dense ceramic film 3 is formed under the optimum film forming conditions by the aerosol deposition method, a compression field may be formed within the film. The magnitude of such a compression field may be compressive stress of 100 MPa or more and several GPa or less in the in-plane direction.

In the case of an insulative heat dissipating body, since the conventional sintered heat dissipating body is subjected to a high-temperature process for bonding the ceramic substrate and the metal plate at a high temperature during manufacturing, a residual thermal stress due to a difference in thermal expansion coefficient between the ceramic substrate and the metal plate is generated, and the ceramic substrate is destroyed. Further, conventionally, a thermal stress is applied to the sintered heat dissipating body by a process of incorporating semiconductors and peripheral equipment, and repeated thermal cycles during use, resulting in destruction of the ceramic substrate. In particular, in the conventional ceramic substrate, a residual tensile stress generated at the time of bonding and a thermal and mechanical stress received at the time of use are combined in the vicinity of the bonding surface with the metal plate, leading to breakage in many cases. In such a ceramic substrate, when a stress due to a thermal cycle is added to the tensile residual stress generated on the bonding surface, a tensile stress of several hundreds MPa may be generated.

On the other hand, in the insulative dissipating body of the present invention, the compressive stress in the in-plane direction remaining in the ceramic film 3 relaxes the stress breaking such a ceramic film 3. As a result, it can also be expected to suppress a breakage due to the thermal stress resulting from repeated thermal cycles at the time of use.

With the above configuration, the ceramic laminate 1 of the present invention has the ceramic film 3 having a minimum film thickness of 1 μm or more, composed of silicon nitride and having a crystal structure in which the silicon nitride crystal grains in the ceramic film 3 have all average grain size of 300 nm or less in the film thickness direction and an average grain size of 500 nm or less in the in-plane direction. Accordingly, in the present invention, a ceramic laminate having excellent mechanical properties, heat dissipation property, insulation property, heat resistance and anti-reactivity, in particular, an insulative heat dissipating body having excellent thermal cycle reliability and high withstand voltage can be provided.

Incidentally, in the case of forming a metal circuit of copper or aluminum on the ceramic film 3 formed on the metal layer 2 in the insulative heat dissipating body of the present invention, it is possible to use a cold spray method, a gas deposition method, an aerosol deposition method, a spraying method, a plating method, or the like to form a metal circuit on the ceramic film 3.

EXAMPLES

Example 1

Using the aerosol deposition device 12, using a β-silicon nitride powder having a grain size (median size) of 0.8 μm and an α-conversion rate of silicon nitride of less than 5 wt % as the silicon nitride powder 18, the ceramic film 3 was formed on 22×22×t 2 mm copper plate (metal layer 2). The β-silicon nitride powder contains 0.2 wt % of iron, 0.1 wt % of aluminum, and 0.1 wt % of calcium as impurities. As other impurities, the presence of $Si_2N_2O$ was confirmed by the X-ray diffraction pattern measurement, and the peak intensity of (200) face of $Si_2N_2O$ was 0.01 times the peak intensity of (200) face of β-silicon nitride. As an aerosol-generating gas and a carrier gas, He gas was used, and the total of the carrier gas flow rate and the aerosol-generating gas flow rate was 15 L/min. The nozzle port at the tip of the aerosol transport pipe 15 was 5×0.3 mm, the angle between the nozzle and the normal line of the copper plate was 30°, and in that state the stage 21 holding the copper plate was driven in the horizontal direction. An aerosol containing β-silicon nitride powder was sprayed to the entire copper plate to form the ceramic film 3. The gas flow velocity calculated by dividing the gas flow rate by the area of the nozzle port was 167 m/s. The above film formation conditions are summarized in Table 1. By visual observation, a gray ceramics film was uniformly formed on the metal. In the FE-SEM observation of the cross section, impurities such as iron were slightly observed in the above-mentioned ceramic film, and in FE-TEM (Field Emission-Transmission Electron Microscope) observation of the cross section, in addition to impurities such as iron, impurities of oxides in an extremely low amount. However, in the X-ray diffraction pattern measurement, peaks of impurities other than the peak of β-silicon nitride and the peak of copper (metal layer) were not found.

A cross section perpendicular to the film surface of Example 1 made of the ceramic film 3/copper plate (metal layer 2) thus prepared was mirror-polished and observed with FE-SEM (ULTRA 55, Carl Zeiss). Accordingly, the average grain size of the crystal grains of β-silicon nitride in the ceramic film 3, the minimum film thickness, the maximum film thickness and the porosity of the ceramic film 3, and the maximum height roughness of the metal layer 2 were examined. As a result, as shown in Table 2, in the ceramic film 3 of Example 1, the average grain size in the film thickness direction y was 100 nm and the average grain size in the in-plane direction x was 150 nm. The minimum film thickness was 3 μm, the maximum film thickness was 5 μm, the porosity was 1%, and the maximum height roughness was 0.7 μm.

Here, the average grain size was determined as follows. As shown in FIG. 3, a line segment y 1 was drawn in the film thickness direction y and a line segment x 1 was drawn in the in-plane direction x in the cross section of the ceramic film 3 in the direction perpendicular to the film surface. The actual length of the line segment y 1 was divided by the number of intersection points P2 between the line segment y 1 and the grain boundary 5 to obtain the average grain size in the film thickness direction y and the actual length of the line segment x 1 was divided by the number of intersection points P1 between the line segment x1 and the grain boundary 5 to obtain the average grain size in the in-plane direction x. The observation magnification of the FE-SEM was 50000 times, and a plurality of points were observed so that the number of the intersection points P2 and P1 totaled 100 or more, respectively. The final average grain size in the film thickness direction y and the average grain size in the in-plane direction x were calculated by averaging all of the data with respect to the average grain size in the film thickness direction y and the average grain size in the in-plane direction x.

Further, the minimum film thickness, the maximum film thickness, and the maximum height roughness were determined by the observation magnification of the FE-SEM set to be 5000 times. As shown in FIG. 2, the minimum film thickness and the maximum film thickness were obtained by observing the portion having the smallest film thickness and the portion having the largest film thickness of the ceramic film 3. The maximum height roughness was obtained by measuring the maximum height difference of the metal layer 2.

Further, the porosity was determined by obtaining the total area of the voids in the ceramic film and dividing the total void area by the total area (including voids) of the ceramic film and multiplying by 100. The magnification of the FE-SEM was set to 50000 times, and the total area of the ceramic film of 300 μm² or more was secured by observing at a plurality of points.

For Example 1, a simple insulation measurement of the ceramic film 3 was carried out by a tester. As a result, it was confirmed that the resistance value was over-range (impossible to display in MΩ) at all five points or more, and thus the film was insulative (indicated by √ in Table 2). This is so because the minimum film thickness is 1 μm or more and the minimum film thickness is at least 1.5 times the maximum height roughness of the metal layer.

In Example 1 in which the β-silicon nitride powder having a grain size of 0.8 μm and the gas flow velocity of 167 m/s were used to form the ceramic film 3, it was confirmed that the ceramic film 3 had a minimum thickness of 1 μm or more and was formed in nano order form such that β-silicon nitride crystal grains have an average grain size of 300 nm or less in the film thickness direction y and an average grain size of 500 nm or less in the in-plane direction x, the film had a porosity of less than 3%, and the film had the minimum film thickness at least 1.5 times the maximum height roughness of the metal layer. The reason why Example 1 was obtained in such a form is presumed as follows. The β-silicon nitride powder has a grain size of 0.8 μm and a gas flow velocity is 167 m/s, which are the optimum grain size and gas flow velocity. As a result, the β-silicon nitride powder collides with the copper plate, the copper plate was not scraped by the β-silicon nitride powder at the time of the collision with the copper plate, and the β-silicon nitride powder was crushed and deformed.

Next, with respect to Example 1, the withstand voltage was measured by a short-time method and the resulting value was divided by the minimum film thickness to obtain the withstand voltage per unit length. As a result, as shown in Table 2, the withstand voltage per unit length was $310 \times 10^6$ V/m, which was at least 10 times larger than that of the conventional sintered silicon nitride substrate. The reason why such a high withstand voltage was obtained is presumed as follows. A dense film having a fine structure of nano order and having no grain boundary phase derived from a sintering aid could be formed. In the case of an insulative heat dissipating body, the minimum thickness of the ceramic film can be made thinner than that of the silicon nitride sintered substrate, and thus the heat dissipating property can be improved.

Next, in Example 1, in order to evaluate the degree of orientation of the ceramic film 3, the X-ray diffraction pattern of the surface of the ceramic film 3 was measured using an X-ray diffractometer (RINT 1500, Rigaku), and the ratio of the X-ray diffraction intensity I (210) of (210) plane to the X-ray diffraction intensity I (101) of (101) plane was calculated. As a result, as shown in the column "I (210)/I (101)" of Table 2, since the β-silicon nitride powder was refined, the ratio of the X-ray diffraction intensity I (210) to the X-ray diffraction intensity I (101) was 3.8.

In Example 1, it was confirmed that a dense film was formed in a nano order form with a porosity of less than 3% in which 11-silicon nitride crystal grains had an average grain size of 300 nm or less in the film thickness direction y and an average grain size of 500 nm or less in the in-plane direction x. As a result, voids as the crack initiation points are few, and the crack propagation can be suppressed, and therefore high strength and fracture toughness can be expected. Further, since the grain boundary phase derived from the sintering aid is not contained in the ceramic film 3, improvement in mechanical properties, heat dissipating property, heat resistance and anti-reactivity can be expected. In addition, since it was confirmed that the c axis having a large thermal expansion coefficient is oriented in the in-plane direction x, the difference in thermal expansion between the film and the copper plate can be reduced as compared to the case where the c axis is not oriented or the case where the c axis is oriented in the film thickness direction y. Therefore, the durability against temperature change can be increased. In the case of an insulative heat dissipating body, a thermal cycle reliability can be improved by the improvement of the mechanical properties and reduction of the difference in thermal expansion when placed under thermal cycling.

Next, the film surface of Example 1 was mirror-polished and observed with FE-SEM (ULTRA 55, Carl Zeiss) to examine an average aspect ratio of β-silicon nitride crystal grains viewed from the film thickness direction. As a result, its value was 1.5, which was confirmed to be smaller than 2.0.

Here, the average aspect ratio was obtained as follows. The observation magnification of the FE-SEM was set to 50,000 times, and 100 or more crystal grains capable of discerning the grain boundaries were selected. The aspect ratio of each crystal grain was calculated by dividing a longitudinal axis size by a short axis size, wherein the longitudinal axis size is a longitudinal length (maximum scissor size) and the short axis size is a lateral length of rectangle, in which the rectangle circumscribes a crystal grain such that the longitudinal length becomes maximum length for each crystal grain, and the resulting values were averaged for all crystal grains to obtain the average aspect ratio.

Since the average aspect ratio of β-silicon nitride crystal grains as viewed from the film thickness direction is smaller than 2.0, a possibility that voids and grain boundary phases are present between the crystal grains is lowered, and variations in various characteristics such as electrical characteristics and thermal characteristics or the like in the film surface can be reduced.

Example 2

Using the aerosol deposition device 12, using a β-silicon nitride powder having a grain size (median size) of 0.8 μm and an α-conversion rate of silicon nitride of less than 5 wt % as the silicon nitride powder 18, the ceramic film 3 was formed on 22×22×t 2 mm copper plate (metal layer 2). The β-silicon nitride powder contains 0.2 wt % of iron, 0.1 wt % of aluminum, and 0.1 wt % of calcium as impurities. As other impurities, the presence of $Si_2N_2O$ was confirmed by the X-ray diffraction pattern measurement, and the peak intensity of (200) face of $Si_2N_2O$ was 0.01 times the peak intensity of (200) face of β-silicon nitride. As an aerosol-generating gas and a carrier gas, $N_2$ gas was used, and the total of the carrier gas flow rate and the aerosol-generating gas flow rate was 8 L/min. The nozzle port at the tip of the aerosol transport pipe 15 was 5×0.3 mm, the angle between the nozzle and the normal line of the copper plate was 30°, and in that state the stage 21 holding the copper plate was driven in the horizontal direction. An aerosol containing β-silicon nitride powder was sprayed to the entire copper plate to form the ceramic film 3. The gas flow velocity calculated by dividing the gas flow rate by the area of the nozzle port was 89 m/s. The above film formation conditions are summarized in Table 1. By visual observation, a gray ceramics film was uniformly formed on the metal.

A cross section perpendicular to the film surface of Example 2 made of the ceramic film 3/copper plate (metal layer 2) thus prepared was mirror-polished and observed with FE-SEM (ULTRA 55, Carl Zeiss). Accordingly, the average grain size of the crystal grains of β-silicon nitride in the ceramic film 3, the minimum film thickness, the maximum film thickness and the porosity of the ceramic film 3, and the maximum height roughness of the metal layer 2 were examined. As a result, as shown in Table 2, in the ceramic film 3 of Example 2, the average grain size in the film thickness direction y was 100 nm and the average grain size in the in-plane direction x was 150 nm. The minimum film thickness was 3 μm, the maximum film thickness was 4 μm, the porosity was 1%, and the maximum height roughness was 0.8 μm. Incidentally, evaluation methods of the average grain size, the minimum film thickness, the maximum film thickness, the porosity and the maximum height roughness were the same as in Example 1.

For Example 2, a simple insulation measurement of the ceramic film 3 was carried out by a tester. As a result, it was confirmed that the resistance value was over-range (impossible to display in MO) at all five points or more, and thus the film was insulative (indicated by √ in Table 2). This is so because the minimum film thickness is 1 μm or more and the minimum film thickness is at least 1.5 times the maximum height roughness of the metal layer.

In Example 2 in which the β-silicon nitride powder having a grain size of 0.8 μm and the gas flow velocity of 89 m/s were used to form the ceramic film 3, it was confirmed that the ceramic film 3 had a minimum thickness of 1 μm or more and was formed in nano order form such that β-silicon nitride crystal grains have an average grain size of 300 nm or less in the film thickness direction y and an average grain size of 500 nm or less in the in-plane direction x, the film had a porosity of less than 3%, and the film had the minimum film thickness at least 1.5 times the maximum height roughness of the metal layer. The reason why Example 2 was obtained in such a form is presumed as follows. The β-silicon nitride powder had a grain size of 0.8 μm and a gas flow velocity was 89 m/s, which are the optimum grain size and gas flow velocity. As a result, the β-silicon nitride powder collided with the copper plate, the copper plate was not scraped by the β-silicon nitride powder at the time of the collision with the copper plate, and the β-silicon nitride powder was crushed and deformed.

Next, with respect to Example 2, the withstand voltage was measured by a short-time method and the resulting value was divided by the minimum film thickness to obtain the withstand voltage per unit length. As a result, as shown in Table 2, the withstand voltage per unit length was $130 \times 10^6$ V/m, which was at least 4 times larger than that of the conventional sintered silicon nitride substrate. The reason why such a high withstand voltage was obtained is presumed as follows. A dense film having a fine structure of nano order and having no grain boundary phase derived from a sintering aid could be formed. In the case of an insulative heat dissipating body, the minimum thickness of the ceramic film can be made thinner than that of the silicon nitride sintered substrate, and thus the heat dissipating property can be improved.

Next, in Example 2, in order to evaluate the degree of orientation of the ceramic film 3, the X-ray diffraction pattern of the surface of the ceramic film 3 was measured using an X-ray diffractometer (RINT 1500, Rigaku), and the ratio of the X-ray diffraction intensity I (210) of (210) plane to the X-ray diffraction intensity I (101) of (101) plane was calculated. As a result, as shown in the column "I (210)/I (101)" of Table 2, since the β-silicon nitride powder was refined, the ratio of the X-ray diffraction intensity I (210) to the X-ray diffraction intensity I (101) was 3.0.

In Example 2, it was confirmed that a dense film was formed in a nano order form with a porosity of less than 3% in which β-silicon nitride crystal grains has an average grain size of 300 nm or less in the film thickness direction y and an average grain size of 500 nm or less in the in-plane direction x. As a result, voids as the crack initiation points are few, and the crack propagation can be suppressed, and therefore high strength and fracture toughness can be expected. Further, since the grain boundary phase derived from the sintering aid is not contained in the ceramic film 3, improvement in mechanical properties, heat dissipating property, heat resistance and anti-reactivity can be expected. In addition, since it was confirmed that the c axis having a large thermal expansion coefficient is oriented in the in-plane direction x, the difference in thermal expansion between the film and the copper plate can be reduced as compared to the case where the c axis is not oriented or the case where the c axis is oriented in the film thickness direction y. Therefore, the durability against temperature change can be increased. In the case of an insulative heat dissipating body, a thermal cycle reliability can be improved by the improvement of the mechanical properties and reduction of the difference in thermal expansion when placed under thermal cycling.

Next, the film surface of Example 2 was mirror-polished and observed with FE-SEM (ULTRA 55, Carl Zeiss) to examine an average aspect ratio of β-silicon nitride crystal grains viewed from the film thickness direction. As a result, its value was 1.5, which was confirmed to be smaller than 2.0. The method of evaluating the average aspect ratio was the same as in Example 1.

Since the average aspect ratio of β-silicon nitride crystal grains as viewed from the film thickness direction is smaller than 2.0, a possibility that voids and grain boundary phases are present between the crystal grains is lowered, and variations in various characteristics such as electrical characteristics and thermal characteristics or the like in the film surface can be reduced.

Example 3

Using the aerosol deposition device 12, using an α-silicon nitride powder having a grain size (median size) of 0.8 μm and an α-conversion rate of silicon nitride of 91 wt % as the silicon nitride powder 18, the ceramic film 3 was formed on 22×22×t 2 mm copper plate (metal layer 2). The α-silicon nitride powder contains 0.02 wt % of iron, 0.09 wt % of aluminum, and 0.1 wt % of calcium as impurities. No peak other than α-silicon nitride and β-silicon nitride was observed in the X-ray diffraction pattern measurement. As an aerosol-generating gas and a carrier gas, $N_2$ gas was used, and the total of the carrier gas flow rate and the aerosol-generating gas flow rate was 8 L/min. The nozzle port at the tip of the aerosol transport pipe 15 was 5×0.3 mm, the angle between the nozzle and the normal line of the copper plate was 30°, and in that state the stage 21 holding the copper plate was driven in the horizontal direction. An aerosol containing α-silicon nitride powder was sprayed to the entire copper plate to form the ceramic film 3. The gas flow velocity calculated by dividing the gas flow rate by the area of the nozzle port was 89 m/s. The above film formation conditions are summarized in Table 1. By visual observation, a gray ceramics film was uniformly formed on the metal.

A cross section perpendicular to the film surface of Example 3 made of the ceramic film 3/copper plate (metal layer 2) thus prepared was mirror-polished and observed with FE-SEM (ULTRA 55, Carl Zeiss). Accordingly, the average grain size of the crystal grains of α-silicon nitride in the ceramic film 3, the minimum film thickness, the maximum film thickness and the porosity of the ceramic film 3, and the maximum height roughness of the metal layer 2 were examined. As a result, as shown in Table 2, in the ceramic film 3 of Example 3, the average grain size in the film thickness direction y was 90 nm and the average grain size in the in-plane direction x was 110 nm. The minimum film thickness was 16 μm, the maximum film thickness was 7 μm, the porosity was 1%, and the maximum height roughness was 0.4 μm. Incidentally, evaluation methods of the average grain size, the minimum film thickness, the maximum film thickness, the porosity and the maximum height roughness were the same as in Example 1, except that the observation magnification of FE-SEM for the minimum film thickness and the maximum film thickness was 2000 times.

For Example 3, a simple insulation measurement of the ceramic film 3 was carried out by a tester. As a result, it was confirmed that the resistance value was over-range (impossible to display in MΩ) at all five points or more, and thus the film was insulative (indicated by √ in Table 2). This is so because the minimum film thickness is 1 μm or more and the minimum film thickness is at least 1.5 times the maximum height roughness of the metal layer.

In Example 3 in which the α-silicon nitride powder having a grain size of 0.8 μm and the gas flow velocity of 89 m/s were used to form the ceramic film 3, it was confirmed that the ceramic film 3 had a minimum thickness of 1 μm or more and was formed in nano order form such that α-silicon nitride crystal grains have an average grain size of 300 nm or less in the film thickness direction y and an average grain size of 500 nm or less in the in-plane direction x, the film had a porosity of less than 3%, and the film had the minimum film thickness at least 1.5 times the maximum height roughness. The reason why Example 3 was obtained in such a form is presumed as follows. The α-silicon nitride powder has a grain size of 0.8 jam and a gas flow velocity is 89 m/s, which are the optimum grain size and gas flow velocity. As a result, the α-silicon nitride powder collides with the copper plate, the copper plate was not scraped by the β-silicon nitride powder at the time of the collision with the copper plate, and the α-silicon nitride powder was crushed and deformed.

Next, with respect to Example 3, the withstand voltage was measured by a short-time method and the resulting value was divided by the minimum film thickness to obtain the withstand voltage per unit length. As a result, as shown in Table 2, the withstand voltage per unit length was $120×10^6$ V/m, which was at least 4 times larger than that of the conventional sintered silicon nitride substrate. The reason why such a high withstand voltage was obtained is presumed as follows. A dense film having a fine structure of nano order and having no grain boundary phase derived from a sintering aid could be formed. In the case of an insulative heat dissipating body, the minimum thickness of the ceramic film can be made thinner than that of the silicon nitride sintered substrate, and thus the heat dissipating property can be improved.

In Example 3, it was confirmed that a dense film was formed in a nano order form with a porosity of less than 3% in which α-silicon nitride crystal grains has an average grain size of 300 nm or less in the film thickness direction y and an average grain size of 500 urn or less in the in-plane direction x. As a result, voids as the crack initiation points are few, and the crack propagation can be suppressed, and therefore high strength and fracture toughness can be expected. Further, since the grain boundary phase derived from the sintering aid is not contained in the ceramic film 3, improvement in mechanical properties, heat dissipating property, heat resistance and anti-reactivity can be expected. In the case of an insulative heat dissipating body, a thermal cycle reliability can be improved by the improvement of the mechanical properties when placed under thermal cycling.

Next, the film surface of Example 3 was mirror-polished and observed with FE-SEM (ULTRA 55, Carl Zeiss) to examine an average aspect ratio of α-silicon nitride crystal grains viewed from the film thickness direction. As a result, its value was 1.3, which was confirmed to be smaller than 2.0. The method of evaluating the average aspect ratio was the same as in Example 1.

Since the average aspect ratio of α-silicon nitride crystal grains as viewed from the film thickness direction is smaller than 2.0, a possibility that voids and grain boundary phases are present between the crystal grains is lowered, and variations in various characteristics such as electrical characteristics and thermal characteristics or the like in the film surface can be reduced.

Comparative Example 1

Using the aerosol deposition device 12, using a β-silicon nitride powder having a grain size (median size) of 2.5 µm and an α-conversion rate of silicon nitride of less than 5 wt % as the silicon nitride powder 18, the ceramic film 3 was formed on 22×22×t 2 mm copper plate (metal layer 2). The β-silicon nitride powder contains 0.2 wt % of iron, 0.1 wt % of aluminum, and 0.1 wt % of calcium as impurities. As other impurities, the presence of $Si_2N_2O$ was confirmed by the X-ray diffraction pattern measurement, and the peak intensity of (200) face of $Si_2N_2O$ was 0.04 times the peak intensity of (200) face of β-silicon nitride. As an aerosol-generating gas and a carrier gas, $N_2$ gas was used, and the total of the carrier gas flow rate and the aerosol-generating gas flow rate was 12 L/min. The nozzle port at the tip of the aerosol transport pipe 15 was 5×0.3 mm, the angle between the nozzle and the normal line of the copper plate was 30°, and in that state the stage 21 holding the copper plate was driven in the horizontal direction. An aerosol containing β-silicon nitride powder was sprayed to the entire copper plate to form the ceramic film 3. The gas flow velocity calculated by dividing the gas flow rate by the area of the nozzle port was 133 m/s. The above film formation conditions are summarized in Table 1. By visual observation, a gray ceramics film was uniformly formed on the metal.

A cross section perpendicular to the film surface of Comparative Example 1 made of the ceramic film 3/copper plate (metal layer 2) thus prepared was mirror-polished and observed with FE-SEM (ULTRA 55, Carl Zeiss). Accordingly, the average grain size of the crystal grains of β-silicon nitride in the ceramic film 3, the minimum film thickness, the maximum film thickness and the porosity of the ceramic film 3, and the maximum height roughness of the metal layer 2 were examined. As a result, as shown in Table 2, in the ceramic film 3 of Comparative Example 1, the average grain size in the film thickness direction y was 740 nm and the average grain size in the in-plane direction x was 910 nm. Further, while the maximum film thickness was 2 µm, there were places where no ceramic film was formed on the metal, and thus the minimum film thickness was 0 µm. The porosity was 5%, and the maximum height roughness was 2.5 µm. Incidentally, evaluation methods of the average grain size, the minimum film thickness, the maximum film thickness, the porosity and the maximum height roughness were the same as in Example 1, except that the observation magnification of FE-SEM for the average grain size was 5000 times.

For Comparative Example 1, a simple insulation measurement of the ceramic film 3 was carried out by a tester. As a result, it was confirmed that the resistance value was several Ω at all five points or more, and thus the film was not insulative (indicated by x in Table 2). This is so because there are a number of points where the metal layer was exposed.

In Comparative Example 1 in which the β-silicon nitride powder having a grain size of 2.5 µm and the gas flow velocity of 133 m/s were used to form the ceramic film 3, the average grain size of the β-silicon nitride crystal grains in the ceramic film was large and its porosity was large as compared to Examples 1-3. In addition, there some points where the metal layer was exposed (minimum film thickness of 0 µm), in contrast to Examples 1-3, and the maximum height roughness of the metal layer was large, resulting in the film being not insulative. The reason thereof is presumed as follows. Since the grain size of the β-silicon nitride was 2.5 µm, which is beyond the optimum grain size, the copper plate was scraped by the β-silicon nitride powder and at the same time, the β-silicon nitride powder was not crushed or deformed when collided with the copper plate.

As described above, Comparative Example 1 did not have insulating property, so it was impossible to measure withstand voltage.

Next, in Comparative Example 1, in order to evaluate the degree of orientation of the ceramic film 3, the X-ray diffraction pattern of the surface of the ceramic film 3 was measured using an X-ray diffractometer (RINT 1500, Rigaku). However, the peak intensities were so small that the ratio of the X-ray diffraction intensity I (210) of (210) plane to the X-ray diffraction intensity I (101) of (101) plane could not be calculated.

In Comparative Example 1, since the minimum film thickness was so small that the film surface could not be polished and the average aspect ratio of silicon nitride crystal grains could not be measured.

Comparative Example 2

Using the aerosol deposition device 12, using a β-silicon nitride powder having a grain size (median size) of 2.5 µm and an α-conversion rate of silicon nitride of less than 5 wt % as the silicon nitride powder 18, the ceramic film 3 was formed on 22×22×t 2 mm copper plate (metal layer 2). The β-silicon nitride powder contains 0.2 wt % of iron, 0.1 wt % of aluminum, and 0.1 wt % of calcium as impurities. As other impurities, the presence of $Si_2N_2O$ was confirmed by the X-ray diffraction pattern measurement, and the peak intensity of (200) face of $Si_2N_2O$ was 0.04 times the peak intensity of (200) face of β-silicon nitride. As an aerosol-generating gas and a carrier gas, He gas was used, and the total of the carrier gas flow rate and the aerosol-generating gas flow rate was 30 L/min. The nozzle port at the tip of the aerosol transport pipe 15 was 5×0.3 mm, the angle between the nozzle and the normal line of the copper plate was 30°, and in that state the stage 21 holding the copper plate was driven in the horizontal direction. An aerosol containing β-silicon nitride powder was sprayed to the entire copper plate to form the ceramic film 3. The gas flow velocity calculated by dividing the gas flow rate by the area of the nozzle port was 333 m/s. The above film formation conditions are summarized in Table 1. By visual observation, a gray ceramics film was uniformly formed on the metal.

A cross section perpendicular to the film surface of Comparative Example 2 made of the ceramic film 3/copper plate (metal layer 2) thus prepared was mirror-polished and observed with FE-SEM (ULTRA 55, Carl Zeiss). Accordingly, the average grain size of the crystal grains of β-silicon nitride in the ceramic film 3, the minimum film thickness, the maximum film thickness and the porosity of the ceramic film 3, and the maximum height roughness of the metal layer 2 were examined. As a result, as shown in Table 2, in the ceramic film 3 of Comparative Example 2, the average grain size in the film thickness direction y was 300 nm and the average grain size in the in-plane direction x was 490 nm. Further, while the maximum film thickness was 4 µm, there were places where no ceramic film was formed on the metal, and thus the minimum film thickness was 0 µm. The porosity was 3%, and the maximum height roughness was 2.3 µm. Incidentally, evaluation methods of the average grain size, the minimum film thickness, the maximum film thickness, the porosity and the maximum height roughness were the same as in Example 1, except that the observation magnification of FE-SEM for the average grain size was 5000 times.

For Comparative Example 2, a simple insulation measurement of the ceramic film 3 was carried out by a tester. As a result, it was confirmed that the resistance value was several Ω at all five points or more, and thus the film was not insulative (indicated by x in Table 2). This is so because there are a number of points where the metal layer was exposed.

In Comparative Example 2 in which the β-silicon nitride powder having a grain size of 2.5 μm and the gas flow velocity of 133 m/s were used to form the ceramic film 3, the average grain size of the β-silicon nitride crystal grains in the ceramic film was large and its porosity was large as compared to Examples 1-3. In addition, there some points where the metal layer was exposed (minimum film thickness of 0 μm), in contrast to Examples 1-3, and the maximum height roughness of the metal layer was large, resulting in the film being not insulative. The reason thereof is presumed as follows. Since the grain size of the β-silicon nitride was 2.5 μm, and the gas flow velocity was 333 m/s, which are beyond the optimum grain size and gas flow velocity, the copper plate was scraped by the β-silicon nitride powder and at the same time, the β-silicon nitride powder was not crushed or deformed when collided with the copper plate.

As described above, Comparative Example 2 did not have insulating property, so it was impossible to measure withstand voltage.

Next, in Comparative Example 2, in order to evaluate the degree of orientation of the ceramic film 3, the X-ray diffraction pattern of the surface of the ceramic film 3 was measured using an X-ray diffractometer (RINT 1500, Rigaku). However, the peak intensities were so small that the ratio of the X-ray diffraction intensity I (210) of (210) plane to the X-ray diffraction intensity I (101) of (101) plane could not be calculated.

In Comparative Example 2, since the minimum film thickness was so small that the film surface could not be polished and the average aspect ratio of silicon nitride crystal grains could not be measured.

Comparative Example 3

Using the aerosol deposition device 12, using a β-silicon nitride powder having a grain size (median size) of 1.2 μm and an α-conversion rate of silicon nitride of less than 5 wt % as the silicon nitride powder 18, the ceramic film 3 was formed on 22×22×t 2 mm copper plate (metal layer 2). The β-silicon nitride powder contains 0.2 wt % of iron, 0.1 wt % of aluminum, and 0.1 wt % of calcium as impurities. As other impurities, the presence of $Si_2N_2O$ was confirmed by the X-ray diffraction pattern measurement, and the peak intensity of (200) face of $Si_2N_2O$ was 0.03 times the peak intensity of (200) face of β-silicon nitride. As an aerosol-generating gas and a carrier gas, He gas was used, and the total of the carrier gas flow rate and the aerosol-generating gas flow rate was 30 L/min. The nozzle port at the tip of the aerosol transport pipe 15 was 5×0.3 mm, the angle between the nozzle and the normal line of the copper plate was 30°, and in that state the stage 21 holding the copper plate was driven in the horizontal direction. An aerosol containing β-silicon nitride powder was sprayed to the entire copper plate to form the ceramic film 3. The gas flow velocity calculated by dividing the gas flow rate by the area of the nozzle port was 333 m/s. The above film formation conditions are summarized in Table 1. By visual observation, a gray ceramics film was uniformly formed on the metal.

A cross section perpendicular to the film surface of Comparative Example 3 made of the ceramic film 3/copper plate (metal layer 2) thus prepared was mirror-polished and observed with FE-SEM (ULTRA 55, Carl Zeiss). Accordingly, the average grain size of the crystal grains of β-silicon nitride in the ceramic film 3, the minimum film thickness, the maximum film thickness and the porosity of the ceramic film 3, and the maximum height roughness of the metal layer 2 were examined. As a result, as shown in Table 2, in the ceramic film 3 of Comparative Example 3, the average grain size in the film thickness direction y was 340 nm and the average grain size in the in-plane direction x was 530 nm. Further, while the maximum film thickness was 4 μm, there were places where no ceramic film was formed on the metal, and thus the minimum film thickness was 0 μm. The porosity was 7%, and the maximum height roughness was 3.7 μm. Incidentally, evaluation methods of the average grain size, the minimum film thickness, the maximum film thickness, the porosity and the maximum height roughness were the same as in Example 1, except that the observation magnification of FE-SEM for the average grain size was 5000 times.

For Comparative Example 3, a simple insulation measurement of the ceramic film 3 was carried out by a tester. As a result, it was confirmed that the resistance value was several Ω at all five points or more, and thus the film was not insulative (indicated by x in Table 2). This is so because a number of points where the metal layer was exposed.

In Comparative Example 3 in which the β-silicon nitride powder having a grain size of 1.2 μm and the gas flow velocity of 333 m/s were used to form the ceramic film 3, the average grain size of the β-silicon nitride crystal grains in the ceramic film was large and its porosity was large as compared to Examples 1-3. In addition, there some points where the metal layer was exposed (minimum film thickness of 0 μm), in contrast to Examples 1-3, and the maximum height roughness of the metal layer was large, resulting in the film being not insulative. The reason thereof is presumed as follows. Since the grain size of the β-silicon nitride was 1.2 μm and the gas flow velocity was 333 m/s, which are beyond the optimum grain size and the optimum gas flow velocity, the copper plate was scraped by the β-silicon nitride powder and at the same time, the β-silicon nitride powder was not crushed or deformed when collided with the copper plate.

As described above, Comparative Example 3 did not have insulating property, so it was impossible to measure withstand voltage.

Next, in Comparative Example 3, in order to evaluate the degree of orientation of the ceramic film 3, the X-ray diffraction pattern of the surface of the ceramic film 3 was measured using an X-ray diffractometer (RINT 1500, Rigaku). However, the peak intensities were so small that the ratio of the X-ray diffraction intensity I (210) of (210) plane to the X-ray diffraction intensity I (101) of (101) plane could not be calculated.

In Comparative Example 3, since the minimum film thickness was so small that the film surface could not be polished and the average aspect ratio of silicon nitride crystal grains could not be measured.

Comparative Example 4

Using the aerosol deposition device 12, using a β-silicon nitride powder having a grain size (median size) of 0.8 μm and an α-conversion rate of silicon nitride of less than 5 wt % as the silicon nitride powder 18, the ceramic film 3 was formed on 22×22×t 2 mm copper plate (metal layer 2). The β-silicon nitride powder contains 0.2 wt % of iron, 0.1 wt % of aluminum, and 0.1 wt % of calcium as impurities. As other impurities, the presence of $Si_2N_2O$ was confirmed by the X-ray diffraction pattern measurement, and the peak intensity of (200) face of $Si_2N_2O$ was 0.01 times the peak intensity of (200) face of β-silicon nitride. As an aerosol-generating gas and a carrier gas, He gas was used, and the total of the carrier gas flow rate and the aerosol-generating gas flow rate was 30 L/min. The nozzle port at the tip of the aerosol transport pipe 15 was 5×0.3 mm, the angle between the nozzle and the normal line of the copper plate was 30°, and in that state the stage 21 holding the copper plate was driven in the horizontal direction. An aerosol containing β-silicon nitride powder was sprayed to the entire copper plate to form the ceramic film 3. The gas flow velocity calculated by dividing the gas flow rate by the area of the nozzle port was 333 m/s. The above film formation conditions are summarized in Table 1. By visual observation, it was found that there were portions where a gray ceramics film was uniformly formed on the metal, and portions where no ceramic film was formed and a metal layer was exposed.

A cross section perpendicular to the film surface of Comparative Example 4 made of the ceramic film 3/copper plate (metal layer 2) thus prepared was mirror-polished and observed with FE-SEM (ULTRA 55, Carl Zeiss). Accordingly, the average grain size of the crystal grains of β-silicon nitride in the ceramic film 3, the minimum film thickness, the maximum film thickness and the porosity of the ceramic film 3, and the maximum height roughness of the metal layer 2 were examined. As a result, as shown in Table 2, in the ceramic film 3 of Comparative Example 4, the average grain size in the film thickness direction y was 100 nm and the average grain size in the in-plane direction x was 210 nm. Further, while the maximum film thickness was 5 μm, there were portions where no ceramic film was formed on the metal, as confirmed by visual observation, and thus the minimum film thickness was 0 μm. The porosity was 1%, and the maximum height roughness was 0.8 Incidentally, evaluation methods of the average grain size, the minimum film thickness, the maximum film thickness, the porosity and the maximum height roughness were the same as in Example 1.

For Comparative Example 4, a simple insulation measurement of the ceramic film 3 was carried out by a tester. As a result, it was confirmed that at the portion where the ceramic film 3 was formed, the resistance value was over-range (impossible to display in MΩ), while at the portions where the metal layer was exposed, as confirmed by visual observation, the resistance value was several Ω and was not over-ranged at all five points or more (indicated by Δ in Table 2).

In Comparative Example 4 in which the β-silicon nitride powder having a grain size of 0.8 μm and the gas flow velocity of 333 m/s were used to form the ceramic film 3, the average grain size of the β-silicon nitride crystal grains and the porosity of the ceramic film, and the maximum height roughness of the metal layer 2 were comparable to those of Examples 1-3. However, there were portions where the metal layer was exposed and thus was not insulative at those portions, in contrast to Examples 1-3. The reason thereof is presumed as follows. Although the grain size of the β-silicon nitride was 0.8 μm, which is the optimum value, the gas flow velocity was 333 m/s, which is beyond the gas flow velocity. Therefore, it is presumed that no film forming phenomenon occurred in some portions.

As described above, Comparative Example 4 comprised portions which did not have insulating property, so it was impossible to measure withstand voltage.

Next, in Comparative Example 4, in order to evaluate the degree of orientation of the ceramic film 3, the X-ray diffraction pattern of the surface of the ceramic film 3 was measured using an X-ray diffractometer (RINT 1500, Rigaku), and the ratio of the X-ray diffraction intensity I (210) of (210) plane to the X-ray diffraction intensity I (101) of (101) plane was calculated. As a result, as shown in the column "I (210)/I (101)" of Table 2, since the β-silicon nitride powder was refined, as in Examples 1-3, the ratio of the X-ray diffraction intensity I (210) to the X-ray diffraction intensity I (101) was 3.6.

In Comparative Example 4, since the minimum film thickness was so small that the film surface could not be polished and the average aspect ratio of silicon nitride crystal grains could not be measured.

Comparative Example 5

A cross section perpendicular to the substrate surface of a silicon nitride sintered substrate having a plate thickness of 320 μm was mirror-polished and observed with FE-SEM (ULTRA 55, Carl Zeiss) to examine an average grain size of the crystal grains of β-silicon nitride. The average grain size of the crystal grains of β-silicon nitride in the plate thickness (film thickness) direction y was 1400 nm and the average grain size in the in-plane direction x was 1700 nm. A grain boundary phase derived from the sintering aid was observed between β-silicon nitride crystals sintered. Incidentally, the method of determining the average grain size was the same as in Example 1, but the observation magnification of FE-SEM was 5000 times. Since Comparative Example 5 was produced by a sintering method, measurement of the porosity and the maximum height of the metal layer, and simple insulation measurement by a tester were not carried out (indicated by—in Table 2).

Since Comparative Example 5 was produced by sintering, in contrast to Examples 1 to 3, the average grain size of β-silicon nitride crystal grains was increased due to grain growth during sintering, and the grain boundary phase derived from the sintering aid was present, Next, with respect to Comparative Example 5, the withstand voltage was measured by a short-time method and the resulting value was divided by the plate thickness to obtain the withstand voltage per unit length. As a result, as shown in Table 2, the withstand voltage per unit length was $28 \times 10^6$ V/m, which was smaller than those of Examples 1 to 3. This is so because the average grain size of β-silicon nitride crystal grains is larger than those of Examples 1 to 3, and a grain boundary phase derived from the sintering aid is present.

Next, in Comparative Example 5, in order to evaluate the orientation degree, the X-ray diffraction pattern of the surface of the substrate was measured using an X-ray diffraction apparatus (RINT 1500, Rigaku), and the ratio of the X-ray diffraction intensity I (210) of (210) plane to the X-ray diffraction intensity I (101) of (1 01) plane was calculated. As a result, as shown in the column "I (210)/I (101)" in Table 2, the ratio of the X-ray diffraction intensity I (210) to the X-ray diffraction intensity I (101) was 2.2, which was smaller than those in Examples 1 and 2.

In Comparative Example 5, as compared with Examples 1 to 3, since the average grain size of the β-silicon nitride crystal grains was large and the grain boundary phase derived from the sintering aid was present. Accordingly, it is difficult to expect an excellent mechanical characteristic, heat dissipation property, heat resistance and anti-reactivity. In addition, since the degree of orientation of the c-axis of the β-silicon nitride crystal in the in-plane direction x is also smaller than in Examples 1 and 2, it is presumed that the effect of increasing the durability against temperature change is also small.

Next, the plate surface of Comparative Example 5 was mirror polished and observed with FE-SEM (ULTRA 55, Carl Zeiss), and the average aspect ratio of β-silicon nitride crystal grains on the plate surface was examined. As a result, because of the columnarization of the crystal grains due to grain growth during sintering, the value of the average aspect ratio was 2.0, which was larger than those of Examples 1 and 2. The method of determining the average aspect ratio was the same as in Example 1, except that the observation magnification of the FE-SEM was 5000 times.

Since the average aspect ratio of β-silicon nitride crystal grains on the plate surface is large, there is a high possibility that variations in various characteristics may occur on the plate surface.

9: Rectangle circumscribing Crystal Grains
10: Longitudinal Axis Size
11: Short Axis Size
12: Aerosol Deposition Device
13: Aerosol-generating Container
14: Deposition Chamber
15: Aerosol Transport Pipe
16: Vacuum Pump
17: Gas Supply System
18: Silicon Nitride Powder
19: Carrier Gas Pipe
20: Aerosol-generating Gas Pipe
21: Stage
22: Horizontal Drive Mechanism
x1, y1: line segments
P1, P2: intersection points

The invention claimed is:

TABLE 1

|  | Silicon nitride powder | α-conversion rate (wt %) | Grain size of Powder (μm) | Aerosol-generating gas/Carrier gas | Gas flow rate (L/min) | Gas flow velocity (m/s) |
| --- | --- | --- | --- | --- | --- | --- |
| Example 1 | β-silicon nitride powder | <5 | 0.8 | He | 15 | 167 |
| Example 2 | β-silicon nitride powder | <5 | 0.8 | $N_2$ | 8 | 89 |
| Example 3 | α-silicon nitride powder | 91 | 0.8 | $N_2$ | 8 | 89 |
| Comparative Example 1 | β-silicon nitride powder | <5 | 2.5 | $N_2$ | 12 | 133 |
| Comparative Example 2 | β-silicon nitride powder | <5 | 2.5 | He | 30 | 333 |
| Comparative Example 3 | β-silicon nitride powder | <5 | 1.2 | He | 30 | 333 |
| Comparative Example 4 | β-silicon nitride powder | <5 | 0.8 | He | 30 | 333 |

TABLE 2

|  | Average grain size of film cross-section in film thickness direction (nm) | Average grain size of film cross-section in in-plane direction (nm) | Minimum film thickness (μm) | Maximum film thickness (μm) | Porosity (%) | Maximum height roughness of metal layer (μm) | Insulation property | Withstand voltage ($10^6$ V/m) | I(210)/I(101) | Average aspect ratio of crystal grains viewed from film thickness direction |
| --- | --- | --- | --- | --- | --- | --- | --- | --- | --- | --- |
| Example 1 | 100 | 150 | 3 | 5 | 1 | 0.7 | ✓ | 310 | 3.8 | 1.5 |
| Example 2 | 100 | 150 | 3 | 4 | 1 | 0.8 | ✓ | 130 | 3.0 | 1.5 |
| Example 3 | 90 | 110 | 16 | 17 | 1 | 0.4 | ✓ | 120 | — | 1.3 |
| Comparative Example 1 | 740 | 910 | 0 | 2 | 5 | 2.5 | x | Not measurable | Not measurable | Not measurable |
| Comparative Example 2 | 300 | 490 | 0 | 4 | 3 | 2.3 | x | Not measurable | Not measurable | Not measurable |
| Comparative Example 3 | 340 | 530 | 0 | 4 | 7 | 3.7 | x | Not measurable | Not measurable | Not measurable |
| Comparative Example 4 | 100 | 210 | 0 | 5 | 1 | 0.8 | Δ | Not measurable | 3.6 | Not measurable |
| Comparative Example 5 | 1400 | 1700 | 320 (plate thickness) | | — | — | — | 28 | 2.2 | 2.0 |

REFERENCE SIGNS LIST

1: Ceramic Laminate
2: Metal Layer
3: Ceramic Film
4: Minimum Film Thickness Portion
5: Maximum Film Thickness Portion
6: Maximum Height Difference of Metal Layer
7: Distance Between the Highest Point and the Lowest Point of Metal Layer in the In-plane Direction
8: Crystal Grains 1. A ceramic laminate in which a ceramic film is formed on a metal layer, wherein the ceramic film has a minimum film thickness of 1 μm or more, contains silicon nitride, and has silicon nitride crystal grains having an average grain size of 300 nm or less in the film thickness direction and an average grain size of 500 nm or less in the in-plane direction, wherein the ceramic film has a porosity of more than 0% and less than 3%, wherein the ceramic laminate does not include a ceramic film having a porosity of 3% or more, wherein the porosity means the ratio of the area occupied by the voids in the ceramic film, including the area of the voids, along the cross section of the ceramic film in the direction perpendicular to the film surface, and wherein the ceramic film has a ratio of the X-ray diffraction intensity I (210) of (210) plane to the X-ray diffraction intensity I (101) of (101) plane of β-silicon nitride crystal exceeding 0.9.

2. The ceramic laminate according to claim 1, wherein the ceramic film has a minimum film thickness at least 1.5 times larger than a maximum height roughness of the metal layer, wherein the maximum height roughness of the metal layer means the maximum height difference of the metal layer at the interface between the ceramic film and the metal layer in the cross section perpendicular to the film surface.

3. The ceramic laminate according to claim 1, wherein the ceramic film has silicon nitride crystal grains having an average grain size of 150 nm or less in the film thickness direction and an average grain size of 250 nm or less in the in-plane direction.

4. The ceramic laminate according to claim 3, wherein the ceramic film has silicon nitride crystal grains having an average grain size of 100 nm or less in the film thickness direction and an average grain size of 150 nm or less in the in-plane direction.

5. The ceramic laminate according to claim 1, wherein the ceramic film contains silicon nitride whose proportion of β-silicon nitride in the silicon nitride exceeds 50 wt %.

6. The ceramic laminate according to claim 1, wherein the ceramic film has a ratio of the X-ray diffraction intensity I (210) of (210) plane to the X-ray diffraction intensity I (101) of (101) plane of the β-silicon nitride crystal exceeding 2.2.

7. The ceramic laminate according to claim 1, wherein the ceramic film contains silicon nitride whose proportion of α-silicon nitride in the silicon nitride exceeds 50 wt %.

8. The ceramic laminate according to claim 1, wherein the ceramic film has silicon nitride crystal grains having an average aspect ratio of smaller than 2.0 when viewed in the film thickness direction.

9. An insulative heat dissipating body characterized by being composed of the ceramic laminate according to claim 1.

10. The insulative heat dissipating body according to claim 9, wherein the minimum film thickness of the ceramic film is 10 μm or more and 100 μm or less.

11. The insulative heat dissipating body according to claim 9, wherein the metal layer is made of copper or aluminum.

12. The insulative heat dissipating body according to claim 9, wherein a metal circuit is formed on the ceramic film.

13. The insulative heat dissipating body according to claim 12, wherein the metal circuit is made of copper or aluminum.

14. The ceramic laminate according to claim 2, wherein the ceramic film has silicon nitride crystal grains having an average grain size of 150 nm or less in the film thickness direction and an average grain size of 250 nm or less in the in-plane direction.

15. The ceramic laminate according to claim 2, wherein the ceramic film contains silicon nitride whose proportion of β-silicon nitride in the silicon nitride exceeds 50 wt %.

* * * * *